United States Patent
Ohno

(10) Patent No.: US 7,247,902 B2
(45) Date of Patent: Jul. 24, 2007

(54) SEMICONDUCTOR DEVICE AND METHOD OF MANUFACTURING THE SAME

(75) Inventor: Keiichi Ohno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/122,720

(22) Filed: May 5, 2005

(65) Prior Publication Data

US 2005/0205914 A1  Sep. 22, 2005

Related U.S. Application Data

(63) Continuation of application No. 09/572,466, filed on May 17, 2000, now Pat. No. 6,965,139.

(30) Foreign Application Priority Data

May 18, 1999  (JP) .............................. P11-137628

(51) Int. Cl.
 *H01L 27/108* (2006.01)
(52) U.S. Cl. .................. 257/296; 257/306; 257/307; 257/308; 257/309; 257/758; 257/905; 257/906; 257/907; 257/908

(58) Field of Classification Search .................. None
See application file for complete search history.

(56) References Cited

U.S. PATENT DOCUMENTS

| | | | | |
|---|---|---|---|---|
| 5,812,444 A | * | 9/1998 | Ema et al. .................. | 365/149 |
| 5,990,507 A | * | 11/1999 | Mochizuki et al. .......... | 257/295 |
| 6,130,449 A | * | 10/2000 | Matsuoka et al. ........... | 257/296 |
| 6,278,148 B1 | * | 8/2001 | Watanabe et al. ........... | 257/296 |
| 6,617,205 B1 | * | 9/2003 | Kimura et al. .............. | 438/210 |

* cited by examiner

*Primary Examiner*—Andy Huynh
*Assistant Examiner*—Hoang-Quan Ho
(74) *Attorney, Agent, or Firm*—Sonnenschein Nath & Rosenthal LLP

(57) ABSTRACT

A semiconductor device comprises a first metal layer, which comprises a buried metal layer connected to a diffusion layer within a substrate or to a lower-layer wiring. A first metal wiring layer, a second metal layer having a buried metal layer, and a second metal wiring layer are sequentially connected. Within a groove passing through insulating layers sandwiching the metal wiring layer from above and below the same as well as on one of the insulating layers there is formed a capacitive element C.

6 Claims, 12 Drawing Sheets

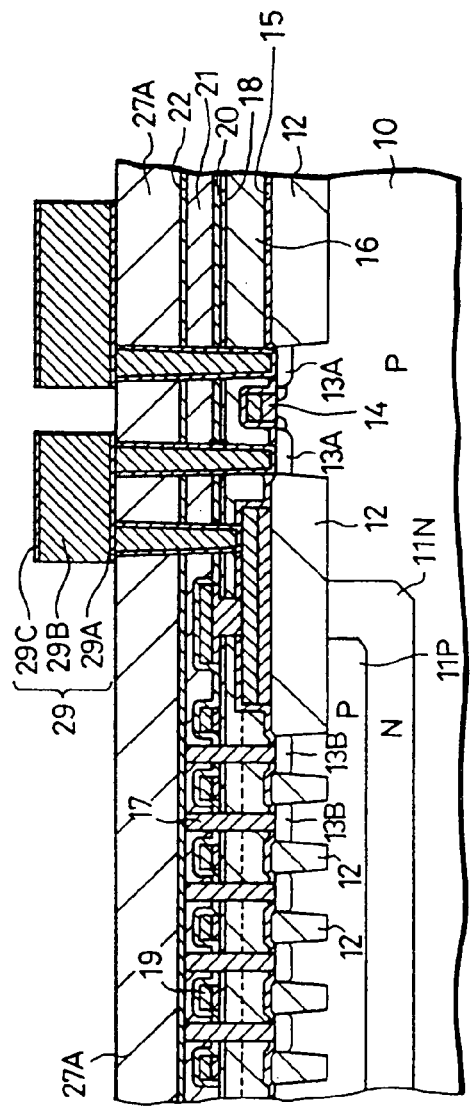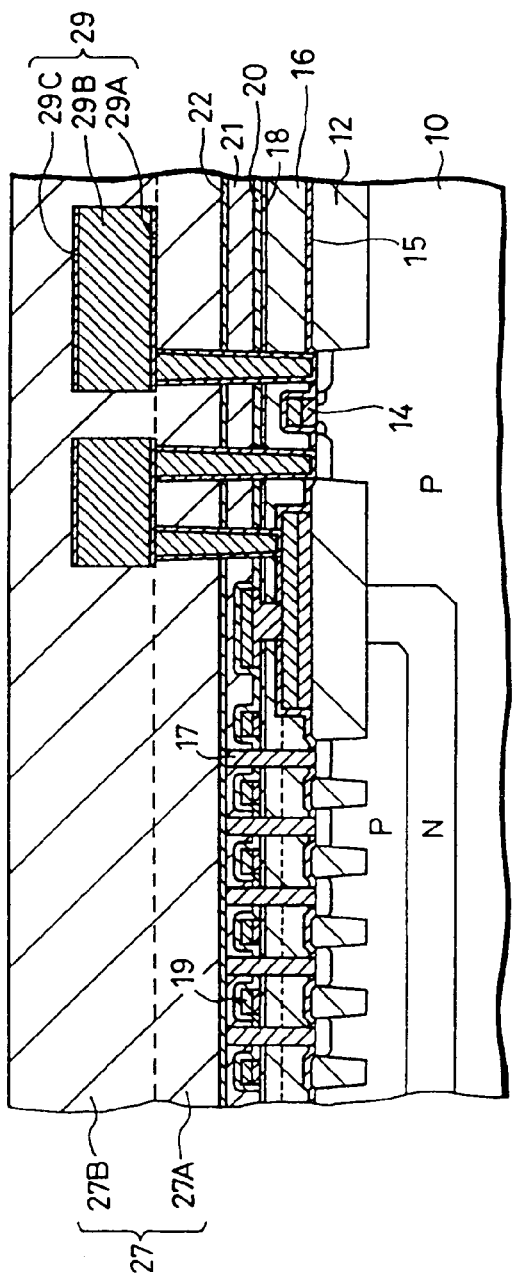
FIG. 3A
FIG. 3B

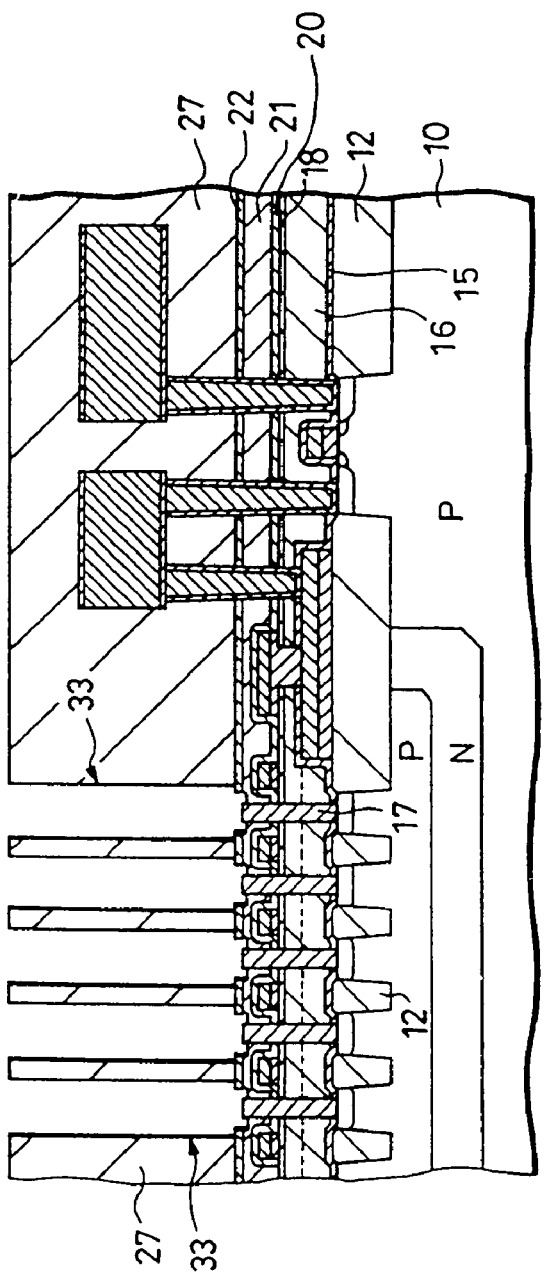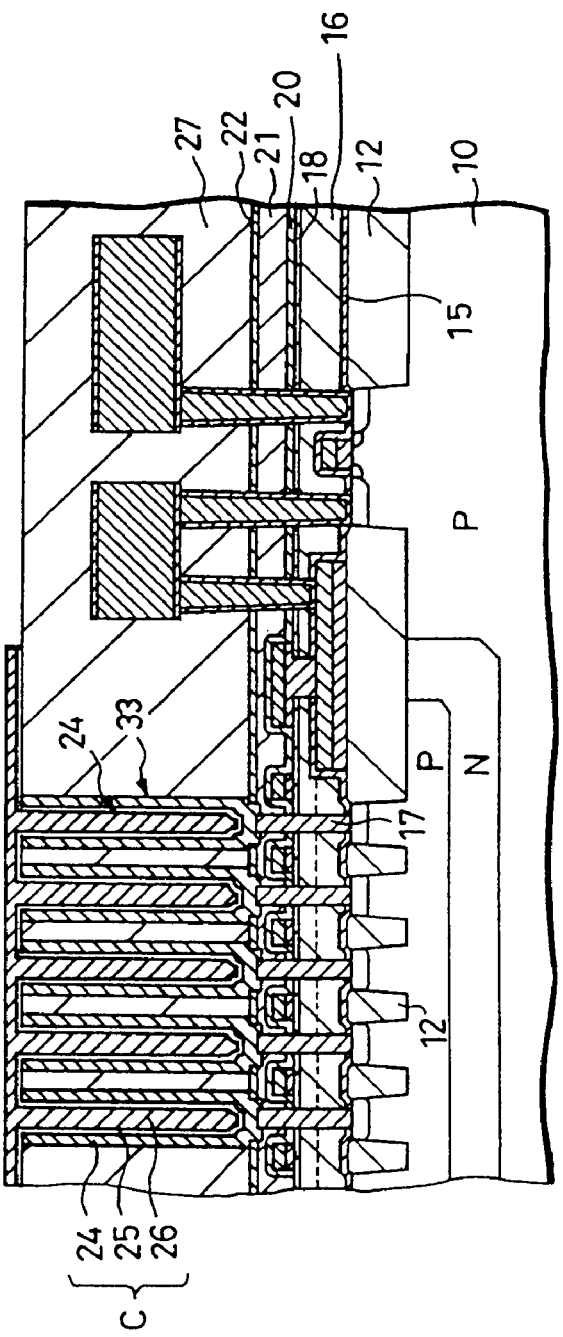
FIG. 4A
FIG. 4B

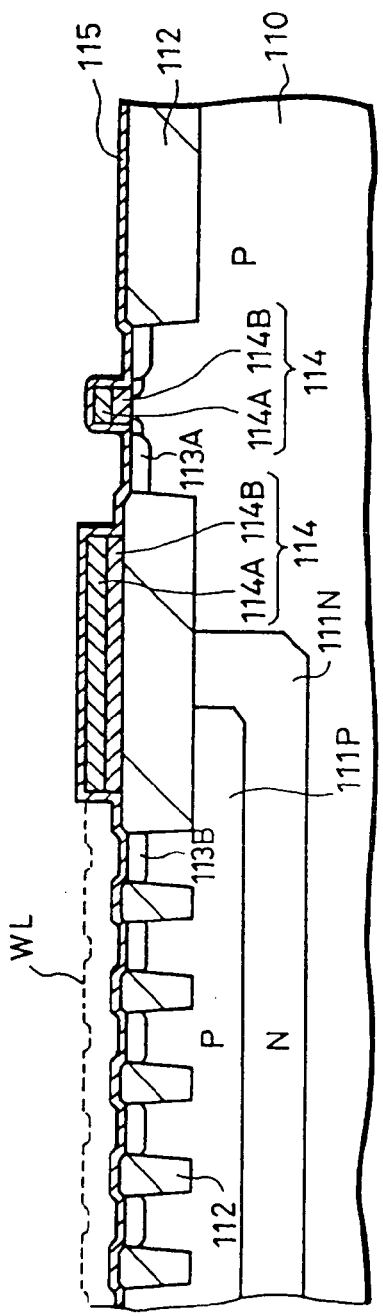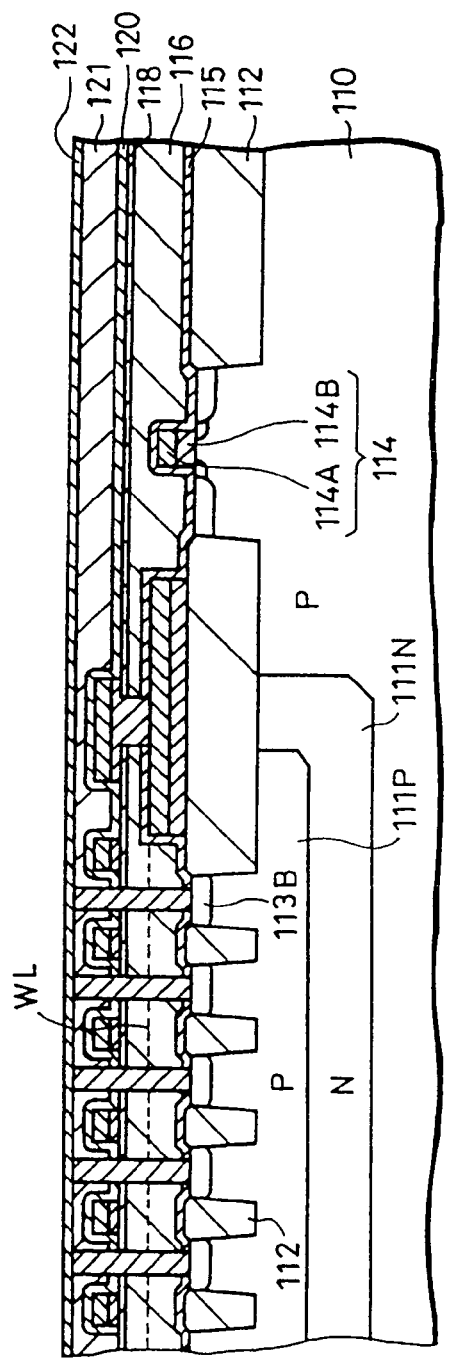
FIG. 11A
FIG. 11B

SEMICONDUCTOR DEVICE AND METHOD OF MANUFACTURING THE SAME

RELATED APPLICATION DATA

The present application is a continuation of U.S. application Ser. No. 09/572,466, filed May 17, 2000 now U.S. Pat. No. 6,965,139 and claims priority to Japanese Application No. P11-137628 filed May 18, 1999, which are incorporated herein by reference to the extent permitted by law.

BACKGROUND OF THE INVENTION

1. Field of the Invention

The present invention relates to a semiconductor device having co-loaded thereon a semiconductor memory such as a DRAM and a logic circuit, and to a method of manufacturing the semiconductor device.

2. Description of the Related Art

There has in recent years been a rapidly increasing demand for an LSI having co-loaded thereon a large capacity of semiconductor memory and a highly integrated high-speed logic circuit.

For realizing a large capacity of semiconductor memory, a DRAM cell, whose formation process has relatively good consistency with that of the logic circuit and whose unit cell area is relatively small, is suitable. Furthermore, even among such DRAM cells, as the structure whose cell area is small, a so-called "COB type (Capacitor Over Bitline)" memory cell structure, wherein a capacitive element is provided on the bit line, is preferable.

A schematic sectional view of a semiconductor device having this COB type semiconductor memory is illustrated in FIG. 10.

This semiconductor device 101 is constructed having co-loaded a semiconductor memory composed of a memory cell portion 102 and a peripheral circuit portion 103, and a logic circuit 104 on the same semiconductor substrate 110.

This semiconductor memory constitutes a so-called "DRAM (Dynamic Random Access Memory)".

In a memory cell portion 102, although not illustrated, a number of parallel word lines WL and a number of parallel bit lines BL are disposed in the form of a matrix.

And, over the bit lines (BL) 119, a capacitive element C composed of a memory node electrode (lower electrode) 124, a dielectric film 125, and a plate electrode (upper electrode) 126 is formed to thereby construct the above-described COB type memory cell structure.

The memory node electrode (lower electrode) 124 of the capacitive element C is formed by being separated every memory cell.

The dielectric film 125 and the plate electrode 126 are formed commonly to a plurality of (or all) memory cells.

In the peripheral circuit portion 103 of the semiconductor memory and the logic circuit 104, in order that it may be connected to a diffusion layer 113A formed in a region within a semiconductor substrate 110 that has been separated by an element-isolating layer 112, a contact layer 128 having a laminated structure of two layers, one being a barrier layer (cohered layer) 128A having a laminated structure of, for example, a titanium film and a TiN film and the other being a buried layer 128B consisting of a tungsten film, is formed within a connecting hole passing through laminated insulating films 115, 116, 118, 120, 121, 122, and 127, and a flattening insulating layer 130.

Further, in order that it may be connected to this contact layer 128, a metal wiring layer 131 having a three-layer structure of 131A, 131B, and 131C and constituting an upper-layer wiring is formed on a flattening insulating layer 130.

It is to be noted that, in FIG. 10, a reference symbol 111N denotes an N type well region formed within, for example, a P type semiconductor substrate 110; a reference symbol 111P denotes a P type well region formed within the N type well region 111N; a reference symbol 113B denotes a diffusion layer of the memory cell portion 102; a reference symbol 114 (114A, 114B) denotes a two-layer-structural gate electrode; and a reference numeral 117 denotes a contact portion of the memory node electrode 124 of the capacitive element C.

Also, the portion where the gate electrode 114 is formed over a large-width range corresponds to the portion where the bit line (BL) 119 of the memory cell portion 102 and the peripheral circuit portion 103 are connected to each other.

At this portion, by a plug-shaped contact layer 117', the bit line (BL) 119 and the gate electrode 114 are connected to each other. A broken line extending leftward from this large-width gate electrode 114 indicates that the word line (WL) of the semiconductor memory that does not exist in this section is extended the position having the same height as that of the gate electrode 114.

The manufacturing process of the semiconductor device 101 is illustrated in FIG. 11 and in FIG. 12.

First, an element-isolating layer 112 is formed in the semiconductor substrate 110 whose region becoming the memory cell portion 102 has formed therein the N type well region 111N and the P type well region 111P. And diffusion layers 113A and 113B are formed in the substrate 110 separated by this element-isolating layer 112.

Next, on the surface of the resulting structure there is formed a thin insulating film (not illustrated) becoming the gate insulating film. Thereafter, the gate electrode 114 having a two-layer structure of 114A and 114B is formed on the surface of the resulting structure. Then, the insulating film (nitride film) 115 is formed over an entire surface of the resulting structure.

This state is illustrated in FIG. 11A. The word line WL indicated by the broken line in the figure is formed at this time.

Next, in such a way as to cover the whole surface of the resulting structure, the layer-insulating layer 116 is formed, after which the thin insulating film 118 is formed on the surface of the resulting structure.

And, on this insulating film 118, the bit line (BL) 119 having a two-layer structure of 119A and 119B is formed, after which the insulating film (nitride film) 120 is formed in such a way as to cover the whole.

Furthermore, in such a way as to cover the whole surface of the resulting structure, the layer-insulating layer 121 is formed.

Thereafter, the connecting holes each passing through the layer-insulating layer 121, insulating film (nitride film) 120, insulating film 118, layer-insulating layer 116, and insulating film (nitride film) 115 are formed in such a way as to reach the diffusion layer 113B. And within each of these connecting holes, for example, a polycrystalline silicon layer is formed as the contact layer 117 of the memory node electrode.

Furthermore, after flattening of the surface of the resulting structure, as illustrated in FIG. 11B, the insulating film (nitride film) 122 is formed in such a way as to cover the whole surface of the resulting structure whose upper surface has been flattened. This insulating film (nitride film) 122 becomes a stopper for later etching.

Next, in the memory cell portion 102, in the insulating film (nitride film) 122 and the layer-insulating layer 121 located under this insulating film 122, an opening corresponding to each memory cell is formed by etching so as to reach the contact layer 117.

And, the memory node electrode (lower electrode) 124 is formed in such a way as to bed in this opening and extend upper than the same.

The formation of this memory node electrode 124 can be performed, for example, as follows.

An oxide film (not illustrated) becoming a sacrifice film is deposited on the resulting surface. The groove having a pattern defining the memory node electrode (lower electrode) 124 is formed up to the depth until which the groove passes through the oxide film and insulating film (nitride film) 122 and further is connected to the contact layer 117 within the layer-insulating layer 121 located under the film 122.

And, in such a way as to bed in this groove, the material of the memory node electrode 124 is deposited therein and, in such a way as for this material to remain on the side walls and the bottom of the groove, the memory node electrode 124 is formed.

In such a way as to cover the memory node electrode (lower electrode) 124, the dielectric film 125 and the plate electrode (upper electrode) 126 are formed over an entire surface of the memory cell portion 102 to thereby construct the capacitive element C.

And, as illustrated in FIG. 12, in such a way as to cover this capacitive element C, the layer-insulating layer 127 is formed wholly thereover.

Next, in order to flatten the level difference between the respective portions of the resulting structure of the memory cell portion 102, the flattening insulating layer 130 is deposited to thereby flatten the surface of the resulting structure.

Thereafter, the connecting holes passing from the flattening insulating layer 130 through the insulating films 127, 122, 120, 118, 116, and 115 located thereunder are formed to thereby form in each of these connecting holes the contact layer 128 consisting of the buried metal layer.

However, in this COB type memory cell structure, in order to make the memory have a sufficiently large capacity, it is needed to increase the height of the capacitive element C. For example, even with the use of a 0.25 μm rule, the height reaches a value as great as approximately 1 μm.

As a result of this, in a case of having flattened the level difference that occurs in the memory cell portion 102, the depth of the contact layer 128 in the peripheral circuit portion 103 and the logic circuit 104 becomes approximately as great as 2 μm. Therefore, in a case where micronization proceeds from now onwards, it is estimated that it will become more and more difficult to make a high integration of the peripheral circuit portion 103 and the logic circuit 104.

Also, the flattening step of flattening the level difference occurring due to the capacitive element C becomes further complex due to the progress of the micronization.

When the aspect ratio of the connecting hole becomes high in the construction of FIG. 10, concretely saying, for example, it becomes difficult to form the TiN film used for the barrier layer 128A of the contact layer 128.

On the other hand, it is also considered to adopt the manufacturing method of forming wiring for use in the peripheral circuit portion 103 and logic circuit 104 while preferentially forming the connecting holes, with the level difference occurring due to the capacitive element C of the memory cell portion 102 remaining the same without being flattened. However, in this case, the existence of the level difference becomes an obstacle to forming the metal wiring layer 131 serving as an upper-layer wiring. Therefore, in this case, also, it becomes difficult to make a higher integration of such portions 103 and 104.

Also, studies have now been also made of the method of decreasing the height of the capacitive element C needed to ensure a desired magnitude of capacity, by using a high-dielectric-constant material in order to form the dielectric film 125 of the capacitive element C.

However, in the case of a high-dielectric-constant material as presently proposed, although the dielectric constant is high, difficulties are encountered in making the dielectric film have a decreased thickness of on the order of several nm to ten and odd nm. Therefore, it is difficult to apply this material to the micronized capacitive element C.

Accordingly, in order to accomplish the increase in the capacity, it results that the height of the capacitive element C becomes greater, with the result that the consistency thereof with the increase in the degree of integration of the logic circuit becomes lost.

SUMMARY OF THE INVENTION

The present invention has been made in order to solve the above-described problems and has an object to provide a semiconductor device and a method of manufacturing the same, which, in a semiconductor device having co-loaded a semiconductor memory and a logic circuit on the same semiconductor substrate, can realize the increase in the capacity of the semiconductor memory and the increase in the degree of integration of the logic circuit.

To attain the above object, the semiconductor device of the present invention is the one which has co-loaded a semiconductor memory composed of a memory cell portion and a peripheral circuit portion and a logic circuit on the same semiconductor substrate, and which comprises a capacitive element that is located upper than a corresponding bit line and that is formed in the memory cell portion, a first metal layer that consists of a buried metal layer embedded within a connecting hole passing through insulating films and that in the peripheral circuit portion and the logic circuit is formed in such a way as to be connected to a diffusion layer formed in the semiconductor substrate or in such a way as to be connected to a lower-layer wiring on the semiconductor substrate, a first metal wiring layer that is formed in such a way as to be connected to the first metal layer substantially in parallel with a main surface of the semiconductor substrate, a second metal layer that consists of a buried metal layer embedded within a connecting hole passing through insulating films and that is formed in such a way as to be connected to the first metal wiring layer, a second metal wiring layer that is formed on an insulating layer located uppercward than the capacitive element in such a way as to be connected to the second metal layer, a groove that passes through insulating layers sandwiching the first metal wiring layer from above and below the same and that is formed in the memory cell portion, and the capacitive element being formed on the groove and an upper one of the insulating layers.

Another semiconductor device of the present invention is the one which has co-loaded a semiconductor memory composed of a memory cell portion and a peripheral circuit portion and a logic circuit on the same semiconductor substrate, and which comprises a capacitive element that is located upper than a corresponding bit line and that is formed in the memory cell portion, a first metal layer that consists of a buried metal layer embedded within a connecting hole passing through insulating films and that in the peripheral circuit portion and the logic circuit is formed in such a way as to be connected to a diffusion layer formed in the semiconductor substrate or in such a way as to be connected to a lower-layer wiring on the semiconductor substrate, a first metal wiring layer that is formed in such a way as to be connected to the first metal layer substantially in parallel with a main surface of the semiconductor substrate, a second metal layer that consists of a buried metal layer embedded within a connecting hole passing through insulating films and that is formed in such a way as to be connected to the first metal wiring layer, a second metal wiring layer that is formed on an insulating layer located upper than the capacitive element in such a way as to be connected to the second metal layer; and that part of an insulating layer on the first metal wiring layer, which is located in the memory cell portion, being removed and the capacitive element being formed at least in a region formed by the removal of the part of the insulating layer.

A method of manufacturing a semiconductor device of the present invention, when manufacturing the semiconductor device having co-loaded a semiconductor memory composed of a memory cell portion and a peripheral circuit portion and a logic circuit on the same semiconductor substrate, comprises the step of forming in the peripheral circuit portion and logic circuit a metal wiring layer on a first layer-insulating layer, the step of forming a second layer-insulating layer in such a way as to cover the metal wiring layer, and the step of removing in the memory cell portion at least respective parts of the first and the second layer-insulating layer, and a capacitive element being formed in regions corresponding to the removed parts of the first and the second layer-insulating layer.

According to the above-described construction of the semiconductor device, the second metal layer and the first metal layer are connected to each other through the intermediary of the first metal wiring layer. As a result of this, the difference in height between the diffusion layer or lower-layer wiring and the second metal wiring layer, which occurs due to the existence of the capacitive element, can be mitigated by the first metal wiring layer. As a result of this, it is possible to make shallow the second metal layer consisting of a buried metal layer.

Also, the capacitive element is formed in the interior of the insulating layers sandwiching the first metal wiring layer from above and below the same and on the insulating layer. As a result of this, the upper end surface of the capacitive element becomes located near the upper end surface of the insulating layer. As a result of this, it is possible to eliminate the level difference that has hitherto occurred due to the capacitive element.

According to the above-described another semiconductor device of the present invention, the capacitive element is formed at least in the region prepared by removing the insulating layer on the first metal wiring layer. As a result of this, the upper end surface of the capacitive element similarly becomes located near the upper end surface of the insulating layer. As a result of this, it is possible to eliminate the level difference that has hitherto occurred due to the capacitive element.

According to the above-described manufacturing method of the present invention, after the metal wiring layers have been formed, the capacitive element is formed. Therefore, it is possible to form the metal wiring layers without being adversely affected by the level difference that occurs due to the capacitive element.

BRIEF DESCRIPTION OF THE DRAWINGS

FIGS. 3A and 3B are process views each illustrating the process of manufacturing the semiconductor device of FIG. 1;

FIGS. 4A and 4B are process views each illustrating the process of manufacturing the semiconductor device of FIG. 1;

FIGS. 11A and 11B are process views each illustrating the process of manufacturing the semiconductor device of FIG. 10; and, FIG. 12 is a process view illustrating the process of manufacturing the semiconductor device of FIG. 10.

DETAILED DESCRIPTION OF THE PREFERRED EMBODIMENT

Figure 1:
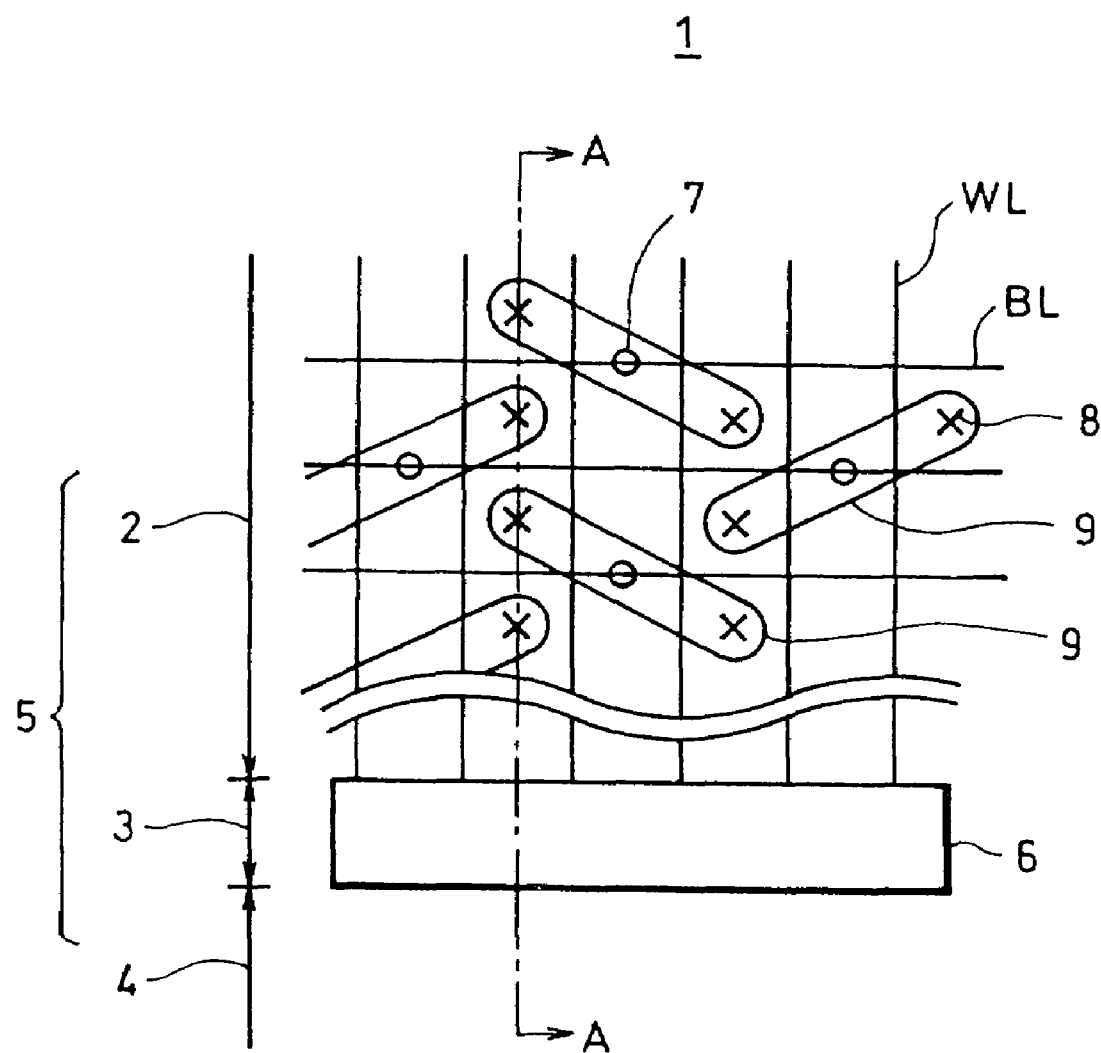
FIG. 1 is a schematic construction view (plan view) of a semiconductor device according to an embodiment of the present invention.

The present invention provides a semiconductor device having co-loaded a semiconductor memory composed of a memory cell portion and a peripheral circuit portion and a logic circuit on the same semiconductor substrate, the semiconductor device comprising a capacitive element that is located upper than a corresponding bit line and that is formed in the memory cell portion, a first metal layer that consists of a buried metal layer embedded within a connecting hole passing through insulating films and that in the peripheral circuit portion and the logic circuit is formed in such a way as to be connected to a diffusion layer formed in the semiconductor substrate or in such a way as to be connected to a lower-layer wiring on the semiconductor substrate, a first metal wiring layer that is formed in such a way as to be connected to the first metal layer substantially in parallel with a main surface of the semiconductor substrate, a second metal layer that consists of a buried metal layer embedded within a connecting hole passing through insulating films and that is formed in such a way as to be connected to the first metal wiring layer, a second metal wiring layer that is formed on an insulating layer located upper than the capacitive element in such a way as to be connected to the second metal layer, a groove that passes through insulating layers sandwiching the first metal wiring layer from above and below the same and that is formed in the memory cell portion, and the capacitive element being formed on the interior of the groove and an upper one of the insulating layers.

Also the present invention has a construction wherein in the semiconductor device the first metal wiring layer is formed integrally with the first metal layer by the use of the same material as that of the first metal layer.

Also the present invention has a construction wherein in the semiconductor device the second metal wiring layer is formed integrally with the second metal layer by the use of the same material as that of the second metal layer.

Also the present invention has a construction wherein in the semiconductor device the first metal wiring layer or the second metal wiring layer consists of a buried metal layer embedded in the insulating film.

The present invention provides a semiconductor device having co-loaded a semiconductor memory composed of a memory cell portion and a peripheral circuit portion and a logic circuit on the same semiconductor substrate, the semiconductor device comprising a capacitive element that is located upper than a corresponding bit line and that is formed in the memory cell portion, a first metal layer that consists of a buried metal layer embedded within a connecting hole passing through insulating films and that in the peripheral circuit portion and the logic circuit is formed in such a way as to be connected to a diffusion layer formed in the semiconductor substrate or in such a way as to be connected to a lower-layer wiring on the semiconductor substrate, a first metal wiring layer that is formed in such a way as to be connected to the first metal layer substantially in parallel with a main surface of the semiconductor substrate, a second metal layer that consists of a buried metal layer embedded within a connecting hole passing through insulating films and that is formed in such a way as to be connected to the first metal wiring layer, a second metal wiring layer that is formed on an insulating layer located upper than the capacitive element in such a way as to be connected to the second metal layer, and that part of an insulating layer on the first metal wiring layer, which is located in the memory cell portion, being removed and the capacitive element being formed at least in a region formed by the removal of the part of the insulating layer.

Also the present invention has a construction wherein in the semiconductor device along the remaining portion of the insulating layer after the removal of the part of this insulating layer a wiring-taking out portion of the capacitive element is formed.

Also the present invention has a construction wherein in the semiconductor device the first metal wiring layer is formed integrally with the first metal layer by the use of the same material as that of the first metal layer.

Also the present invention has a construction wherein in the semiconductor device the second metal wiring layer is formed integrally with the second metal layer by the use of the same material as that of the second metal layer.

Also the present invention has a construction wherein in the semiconductor device the first metal wiring layer or the second metal wiring layer consists of a buried metal layer embedded within a corresponding insulating film.

The present invention provides a method of manufacturing a semiconductor device, the method being a method of manufacturing the semiconductor device having co-loaded a semiconductor memory composed of a memory cell portion and a peripheral circuit portion and a logic circuit on the same semiconductor substrate, the method comprising the step of forming in the peripheral circuit portion and logic circuit a metal wiring layer on a first layer-insulating layer, the step of forming a second layer-insulating layer in such a way as to cover the metal wiring layer, and the step of removing in the memory cell portion at least respective parts of the first and the second layer-insulating layer, a capacitive element being formed in regions corresponding to the removed parts of the first and the second layer-insulating layer.

Also the present invention has a construction wherein in the method of manufacturing the semiconductor device a groove corresponding to each memory cell is formed by removing respective parts of the first and the second layer-insulating layer; and on a bottom and inner wall of the groove there is formed a lower electrode of the capacitive element.

Also the present invention has a construction wherein in the method of manufacturing the semiconductor device after the forming of the lower electrode, removal is performed of the second layer-insulating layer of the memory cell portion, whereby over the lower electrode a dielectric film and an upper electrode are formed to thereby form a capacitive element.

Also the present invention has a construction wherein in the method of manufacturing the semiconductor device a wiring taking-out portion of the upper electrode is formed along the remaining second layer-insulating layer.

First, as an embodiment of the present invention, a schematic construction view (plan view) of a semiconductor device is illustrated in FIG. 1.

This semiconductor device 1 has a construction having co-loaded a semiconductor memory 5 composed of a memory cell portion 2 and peripheral circuit portion 3 and a logic circuit 4 on the same semiconductor substrate.

In the memory cell portion 2, a number of parallel word lines WL and a number of bit lines BL are disposed in the form of a matrix.

In the peripheral circuit portion 3, as a drive circuit 6 for driving the word lines WL, an address decoder, etc. is provided. It is to be noted that, although not illustrated, the drive circuit such as an address decoder is similarly provided also with respect to the bit lines BL.

In the memory cell portion 2, a diffusion layer 9 formed within the substrate is disposed in such a way as to extend obliquely. This is because, as described later, the capacitive element is formed upper than the substrate, and because it is necessary that a contact portion 8 (marked "x" in the figure) connecting a memory node electrode of the capacitive element and the diffusion layer 9 be formed at the portion where the bit lines BL and word lines WL do not exist.

Also, a reference numeral 7 that is indicated by the mark ○ in the figure represents a contact portion between the diffusion layer 9 and the bit line BL. And this contact portion is formed at the portion where the word line WL does not exist.

Figure 2:
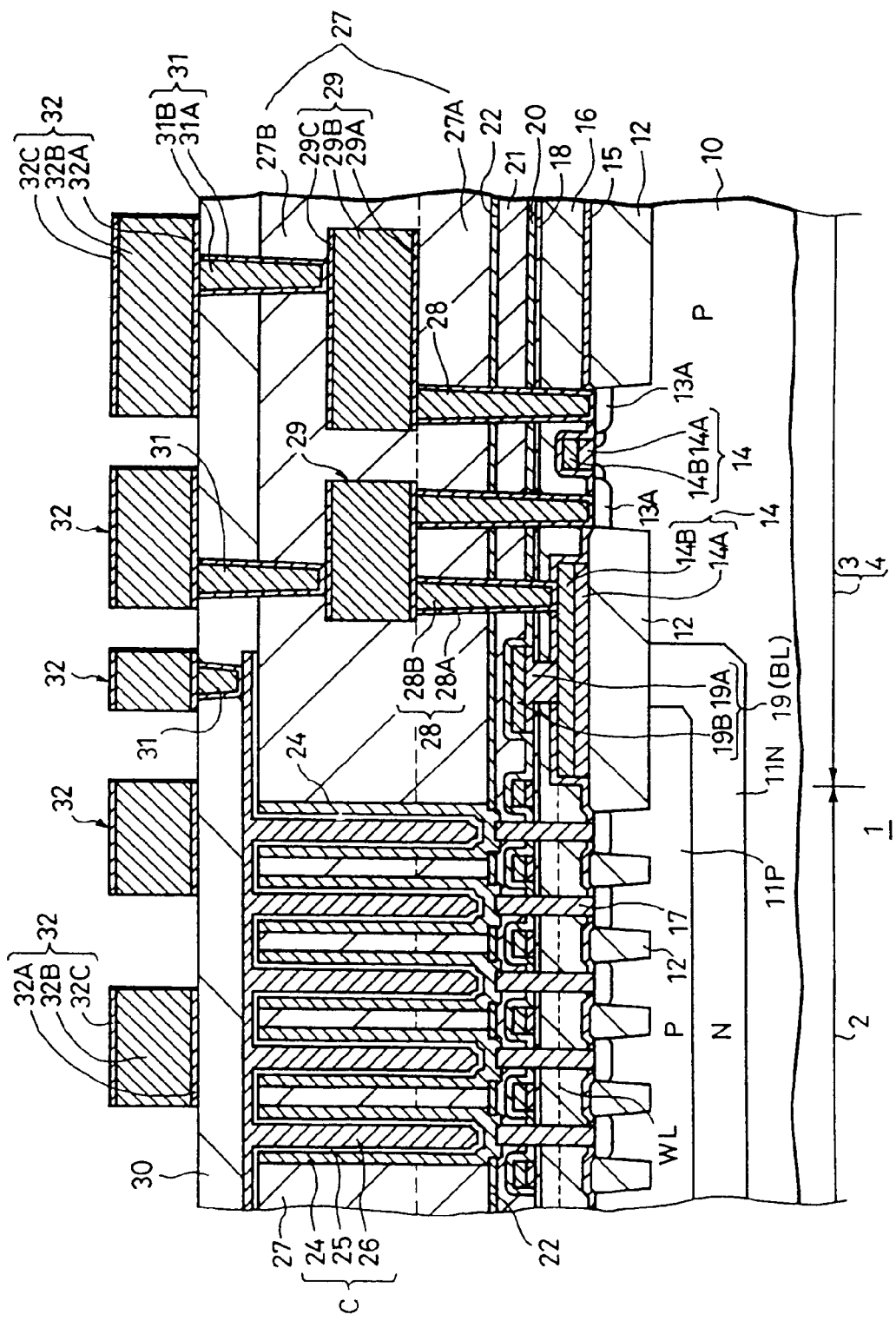
FIG. 2 is a schematic construction view taken along a line A—A of FIG. 1.

Next, a sectional view taken along a line A—A in the plan view of FIG. 1 is illustrated in FIG. 2.

As illustrated in FIG. 2, in this semiconductor device 1, on the same semiconductor substrate 10 there are formed the memory cell portion 2 and peripheral circuit portion 3 of the semiconductor memory and the logic circuit 4.

Figure 10:
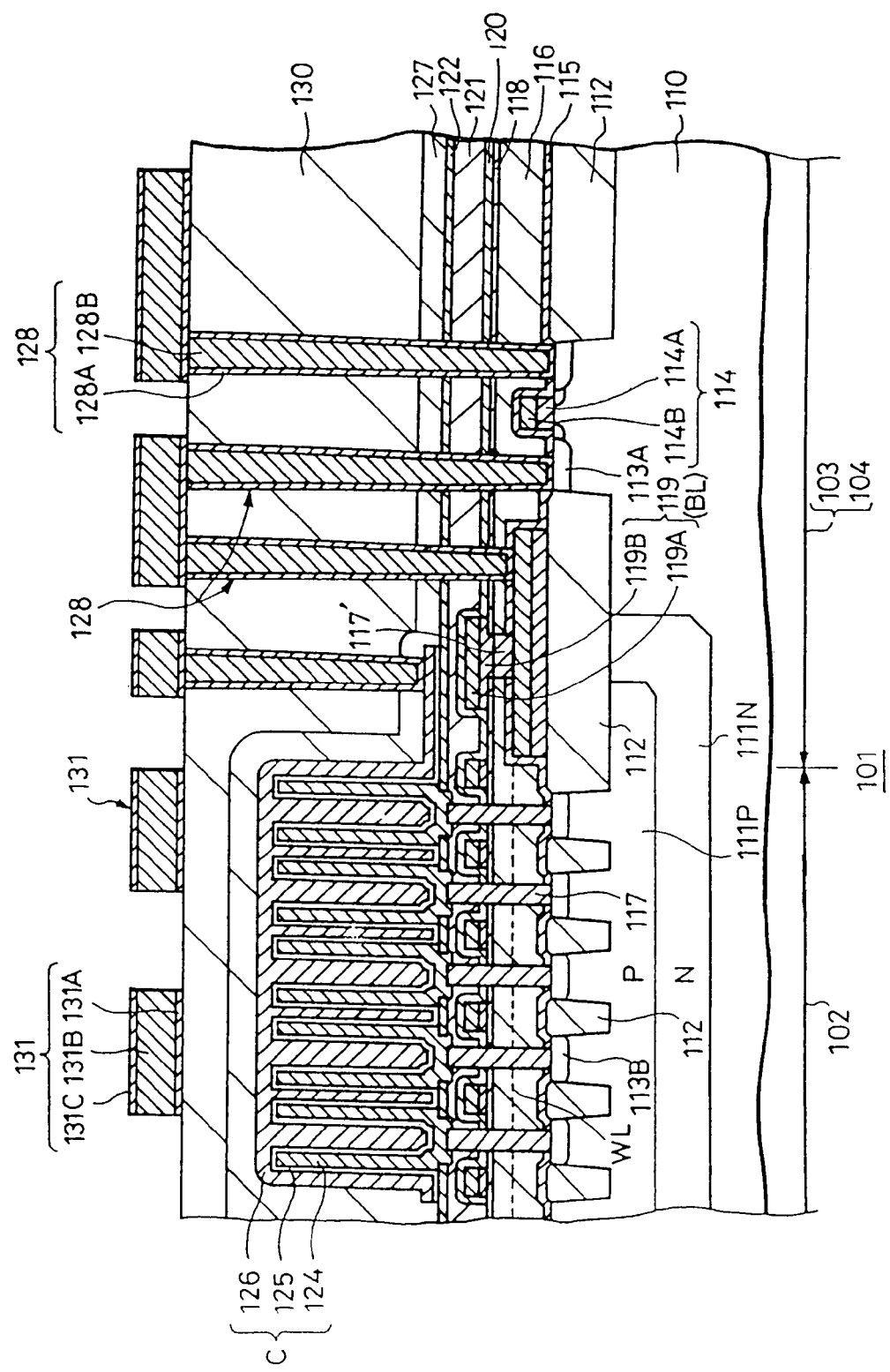
FIG. 10 is a schematic sectional view illustrating a semiconductor device having a COB type semiconductor memory.
Figure 12:
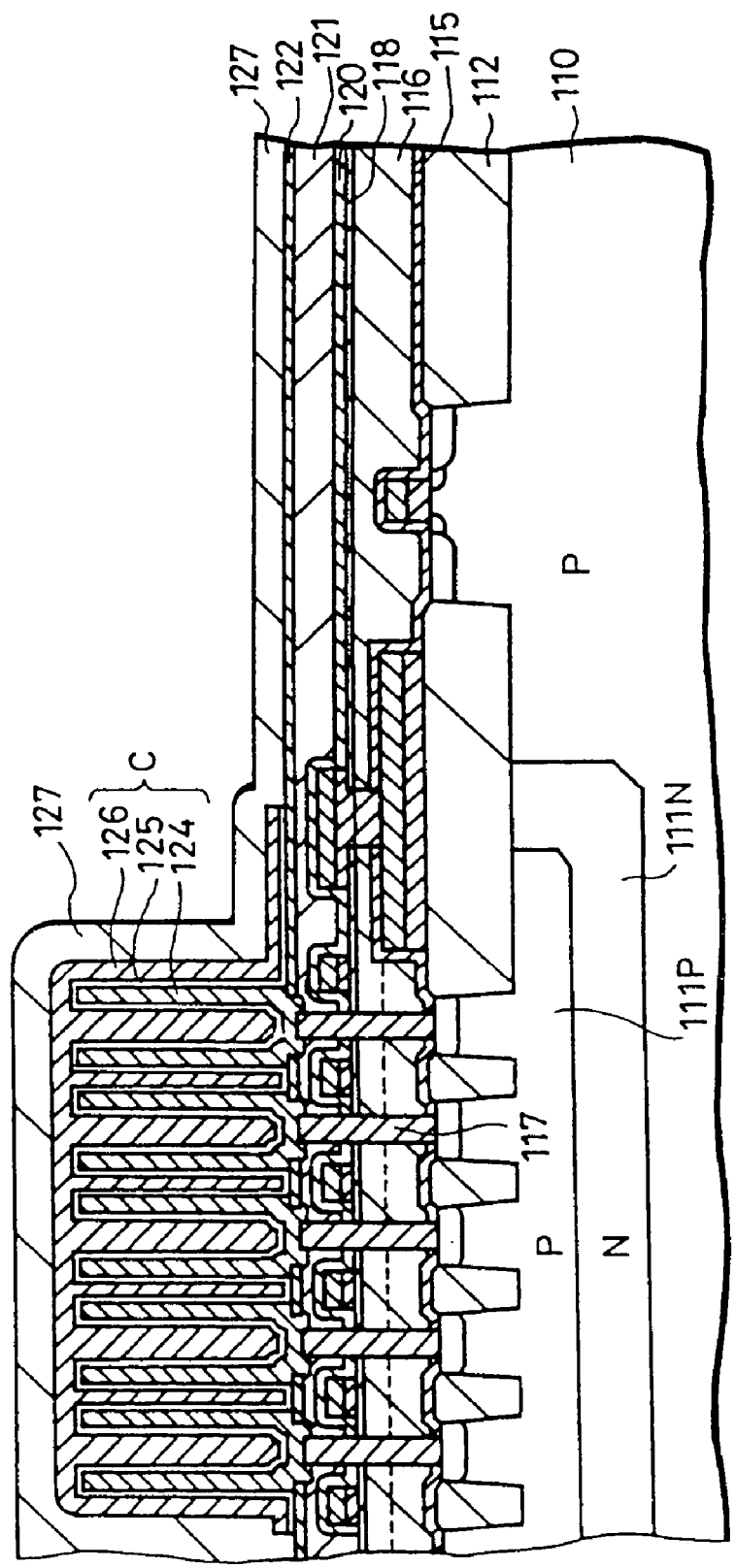

This semiconductor memory 5 constitutes a DRAM as in the case of FIG. 10.

And, in the memory cell portion 2, the capacitive element is formed in the portion upper than the bit line (BL) 19, and this capacitive element constitutes the previously stated COB type memory cell structure.

First, in the memory cell portion 2, a diffusion layer 13B is formed in each of the regions isolated from each other by an element-isolating layer 12 within, for example, the P type semiconductor substrate 10. This diffusion layer 13B is the diffusion layer 9 that has been illustrated in FIG. 1.

The respective surfaces of this element-isolating layer 12 and diffusion layer 13B are covered thereover with an insulating film 15 consisting of, for example, $Si_3N_4$ or $SiO_2$. Further, the upper surface of this insulating film 15 is covered by a layer-insulating layer 16 the upper surface of which is flattened.

On the layer-insulating layer 16 there is formed the bit line (BL) 19 with a two-layer structure of 19A and 19B via an insulating film 18. The bit line 19 is covered by an insulating film 20 consisting of a nitride film ($Si_3N_4$). On this insulating film (nitride film) 20 there is formed a layer-insulating layer 21.

Connecting holes are formed at the portions of the insulating film 15, layer-insulating layer 16, insulating film 18, insulating film (nitride film) 20, and layer-insulating layer 21 which are located over the diffusion layers 13B. Through each of these connecting holes, a contact layer 17 becoming the contact portion 8 of the memory node electrode indicated by the mark x in FIG. 1 is formed in such a way as to be connected to the diffusion layer 13B.

It is to be noted that the portion in FIG. 2 at which the gate electrode 14 is formed over a large-width zone represents a portion for connecting the bit line (BL) 19 of the memory cell portion 2 and the peripheral circuit portion 3.

At that portion, through the intermediary of a plug-like contact layer, the bit line (BL) 19 and the gate electrode 14 are connected to each other.

Also, each of the word lines WL that are provided at other positions than those corresponding to the line A—A of FIG. 1, although not illustrated, is connected to the large-width gate electrode 14, and each word line WL is further extended to the same height position as that of the gate electrode as indicated by a broken line on the left side.

In this embodiment, especially the structure of the memory cell portion 2 upper than this layer-insulating layer 21, especially the structure of the capacitive element C is different from that in the construction illustrated in FIG. 10.

On the layer-insulating layer 21 there is formed an insulating film (nitride film) 22, on which a relatively thick layer-insulating layer 27 is further formed.

And, in each of the grooves formed through part of the layer-insulating layer 21, insulating film (nitride film) 22, and layer-insulating layer 27, the memory node electrode (lower electrode) 24 of the capacitive element C is formed in such a way as to be extended upward and in such a way as to be isolated in every memory cell. The memory node electrode 24 is connected to the above-described contact layer 17.

And, in such a way as to cover the memory node electrode (lower electrode) 24, a dielectric film 25 is formed in the interior of the groove and on the layer-insulating layer 27, and further in such a way as to cover the dielectric film 25 there is formed a comb-like plate electrode (upper electrode) 26. The dielectric film 25 and plate electrode 26 are formed commonly with respect to a plurality of (or all) the memory cells.

The capacitive element C is constructed of this memory node electrode (lower electrode) 24, dielectric film 25, and plate electrode (upper electrode) 26.

Namely, the capacitive element C is formed in the interior of the groove passing through the layer-insulating layer 27, and further the upper surface of the comb-like plate electrode (upper electrode) 26 is situated over the layer-insulating layer 27.

Further, the capacitive element C is wholly covered thereover with a flattening insulating layer 30.

This flattening insulating layer 30 is commonly formed with respect to the memory cell portion 2 and the other portions 3 and 4 as a whole. And on this flattening insulating layer 30 there is formed a metal wiring layer 32 as later described.

On the other hand, in the peripheral circuit portion 3 and logic circuit 4 of the semiconductor memory, the diffusion layer 13A is formed in the region within the semiconductor substrate 10 isolated by the element-isolating layer 12.

On the substrate 10, via a thin gate insulating film not illustrated, there is formed the gate electrode 14 having a two-layer structure of 14A and 14B.

The above-described insulating film (nitride film) 15 covers this gate electrode 14 and, as in the case of the memory cell portion 2, the layer-insulating layer 16 whose upper surface is flattened covers the insulating film 15. On this layer-insulating layer 16, as in the case of the memory cell portion 2, the insulating film 18 and the insulating film (nitride film) 20 covering the bit line 19 are formed in a form of being laminated thereon. As in the case of the memory cell portion 2, on this insulating film (nitride film) 20, there is formed the layer-insulating layer 21, on which the insulating film (nitride film) 22 is formed.

On the insulating film (nitride film) 22, there is formed the layer-insulating film 27 having formed therein the capacitive element C in the zone corresponding to the memory cell portion 2.

This layer-insulating layer 27 is constructed of two portions 27A and 27B, the border between that is indicated by a broken line in FIG. 2. These two portions 27A and 27B sandwiches the first metal wiring layer 29.

And, on the border line between the two portions 27A and 27B of the layer-insulating layer 27, the first metal wiring layer 29 having a three-layer structure of 29A, 29B, and 29C is formed substantially in parallel with the main surface of the semiconductor substrate 10.

This first metal wiring layer 29 can be constructed, for example, with a three-layer structure of a laminated film 29A of Ti film/TiN film, an Al—Cu film 29B, and a TiN film 29C.

Furthermore, under this first metal wiring layer 29, there are formed connecting holes each passing through the laminated insulating films 15, 16, 18, 20, 21, 22, and a part 27A of layer-insulating layer 27. In each of these connecting holes, there is formed a first contact layer 28 having a laminated structure of a barrier layer (cohered layer) 28A, having a laminated structure of, for example, a titanium film and a TiN film, and a buried layer 28B that consists of a tungsten film.

By means of this first contact layer 28, the first metal wiring layer 29 and the diffusion layer 13A or the gate electrode 14 are connected to each other.

The above-described layer-insulating layer 27 (27B) covers the first metal wiring layer 29 from above the same. On this layer 27B there is formed the above-described flattening insulating layer 30.

And, on this flattening insulating layer 30, there is formed a second metal wiring layer 32 having a three-layer structure of 32A, 32B, and 32c.

This second metal wiring layer 32 is not only formed on the logic circuit 4 and peripheral circuit portion 3 but is also formed over the capacitive element C of the memory cell portion 2.

And, the respective upper surfaces of the plate electrode (upper electrode) 26 and memory node electrode (lower electrode) 24 of the capacitive element C are located at around a height position existing approximately intermediately between the first metal wiring layer 29 and the second metal wiring layer 32.

The first metal wiring layer 29 and the second metal wiring layer 32 are connected to each other by the second contact layers 31 each formed within the connecting hole formed in the flattening insulating layer 30 and the part 27B of the layer-insulating layer 27. This second contact layer 31 has the same laminated structure as that of the first contact layer 28.

As a result of this, the second metal wiring layer 32 is connected to the diffusion layer 13A within the substrate 10 or the gate electrode 14 through the second contact layer 31, first metal wiring layer 29, and first contact layer 28. The second metal wiring layer 32 is thereby connected to a circuit such as a transistor that is for driving the word line WL contained in, for example, the drive circuit 6.

Also, the second contact layer 31 having the same construction as that within the connecting hole formed in the flattening insulating layer 30 connects the portion (the wiring taking-out portion), formed on the layer-insulating layer 27, of the upper electrode 26 of the capacitive element of the memory cell portion 2.

According to the construction of the above-described semiconductor device 1 of this embodiment, the first metal wiring layer 29 is connected to the diffusion layer 13A or the second metal wiring layer 32, respectively, via the first contact layer 28 and the second contact layer 31. Therefore, when forming the connecting holes for use on the second contact layer 31, it is possible to use the first metal wiring layer 29 as a stopper for etching. Simultaneously, it is possible to make large the margin that is had with respect to the positional displacement of the etching.

Also, it is possible to lessen the amount of over-etching when forming the connecting hole for use on the second contact layer 31.

Also, the first metal wiring layer 29 is a metal layer and can be also formed relatively thick. Therefore, the resistance of this first metal wiring layer 29 can be easily decreased.

Accordingly, the first metal wiring layer 29 can be used for local wiring.

And, according to this embodiment, it is possible to form the first metal wiring layer 29 thickly. Therefore, it is possible to smallen by the first metal wiring layer 29 the difference in height between the upper-layer wiring (the second metal wiring layer 32) and the diffusion layer 13A within the substrate 10 or the lower-layer wiring 14, which occurs due to the capacitive element C.

As a result of this, it is possible to make shallow each of the first contact layer 28 and second contact layer 31, namely to form it by decreasing its aspect ratio. Therefore, it is possible to easily form this first contact layer 28 and second contact layer 31.

Accordingly, even when the difference in height occurring due to the capacitive element C increases, because the forming of the contact layer 28 and 31 becomes possible, it is possible to sufficiently use the spatial region from the bit line 19 to the second metal wiring layer 32. And, therefore, by the sufficient use of the spatial region, it is possible to form the capacitive element C having a sufficient height great enough to ensure the capacity. Therefore, it is possible to make the capacity of the semiconductor memory 4 large.

Also, the upper end surface of the capacitive element C becomes more approached to the upper end surface of the layer-insulating layer 27, with the result that it is possible to make substantially zero the level difference conventionally occurring due to the capacitive element. Therefore, it is possible to easily form the second metal wiring layer 32 that is the upper-layer wiring.

Furthermore, according to this embodiment, the second metal wiring layer 32 that is the upper-layer wiring is also formed over the capacitive element C of the memory cell portion 2. Therefore, the second metal wiring layer 32 can be made to function, for example, as a backing wiring of the word line WL or a sub-decode line for decoding the word line WL, or a plate electrode line, or a shunt wiring of the drive circuit 6.

As the metal wiring layer having this kind of function, in the conventional construction, the metal wiring of the first layer directly contacted with the diffusion layer serves as illustrated in FIG. 10. However, in this embodiment, the metal wiring of the second layer serves. It is to be noted that, in this embodiment, the first metal wiring layer 29 corresponds to the metal wiring of the first layer.

Also, using the first metal wiring layer 29 and second metal wiring layer 32 in the region of the logic circuit 4, it is possible to construct a so-called "standard cell", namely a standardized version of a functional block prepared by lumping several parts together.

By using this standard cell and by also constructing that functional block (macro cell) having the function of a DRAM which also includes the decode line by the use of the first and second metal wiring layers 29 and 32, it becomes possible to make the connection between the loaded functional cells with the use of a third and its thereafter-succeeding metal wiring layers.

As a result of this, it becomes possible to construct a large-scale semiconductor device by lumping several standard cells together.

It is to be noted that in the logic circuit 4 having co-loaded thereon the semiconductor memory 5 such as a DRAM the number of the metal wiring layers increases compared to a general-purpose DRAM. Therefore, even if incorporating a functional block having the function of a DRAM, this has almost no effect upon the degree of integration of the logic circuit 4.

Also, by constructing the first metal wiring layer 29 and the second metal wiring layer 32 by the use of, for example, materials as later described, each of these layers 29 and 32 can be made to have a resistance value of 100 mΩ/□ or less.

And, according to this embodiment, because the embodiment has the above-described effects, it is possible to achieve a further increase in the degree of integration of the logic circuit 4 as well as the peripheral circuit portion 3.

Namely, it is possible to realize both the increase in the capacity and the increase in the degree of integration.

FIGS. 3A, 3B, 4A, and 4B are views each illustrating the manufacturing process of the semiconductor device 1 according to this embodiment.

First, using a known method, etc., the respective layers up to the layer-insulating layer 21 are formed. And, in the memory cell portion 2, the connecting holes passing through the insulating layers 15, 16, 18, 20, and 21 to reach the diffusion layer 13B are formed. In each of these connecting holes, as the contact layer 17 of the memory electrode, for example, a polycrystalline layer is formed and, by performing heat treatments, these polycrystalline layers are activated.

Next, the insulating film (nitride film) 22 is formed over the entire surface of the resulting structure. The process steps up to this step is the same as those illustrated in FIGS. 11A and 11B.

Next, in such a way as to cover this insulating film (nitride film) 22, the layer-insulating layer 27A is formed so that a total thickness of the insulating films under the first metal wiring layer 29 formed later may become a desired thickness.

In this embodiment, prior to forming the capacitive element C, the first metal wiring layer 29 is formed on this layer-insulating layer 27A. Therefore, it is not necessary, after forming this layer-insulating layer 27A, to newly deposit a thick insulating film to thereby perform flattening.

Then, in the peripheral circuit portion 3 and logic circuit 4, the connecting holes passing through the insulating films 15, 16, 18, 20, 21, 22, and 27 to reach the diffusion layer 13A are formed.

Subsequently, within each of these connecting holes, as the barrier layer 28A, for example, a TiN film is deposited to a prescribed thickness of, for example, 50 nm using a method of extended-range sputter or a method of collimated sputter (collimated sputter). Subsequently, for example, a Ti film is sequentially deposited to a prescribed thickness of, for example, 30 nm or so.

Further, as the buried layer 28B, for example, a film of W is deposited to a prescribed thickness of, for example, 600 nm or so.

Then, by performing etch-back with respect to these layers, the first contact layer 28 consisting of the buried metal layer is formed within each connecting hole.

These process steps are basically the same as those of a manufacturing method used for the forming of a plug-like W film that is performed using an ordinary blanket connection.

Next, on the layer-insulating layer 27A in other region than that corresponding to the memory cell portion 2, in such a way as to be connected to the first contact layers 28, the first metal wiring layer 29 having a three-layer structure of 29A, 29B, and 29C is formed into a desired pattern.

FIG. 3A illustrates a state that corresponds to this stage of manufacture.

Here, it is assumed that, as illustrated in FIG. 2 for example, the first metal wiring layer 29 has been constructed with a laminated structure of three films, i.e., a laminated film 29A of a Ti film and TiN film, an Al—Cu film 29B, and a TiN film 29C. And it is also assumed that in this case the Ti film and the TiN film of the laminated film 29A are respectively made to have prescribed thicknesses of, for example, 30 nm or so and 50 nm or so; the Al—Cu film 29B is made to have a prescribed thickness of, for example, 500 nm or so; and the TiN film 29C is made to have a prescribed thickness of, for example, 70 nm or so. In this case, a sum total of these film thicknesses becomes 650 nm or so.

Next, as illustrated in FIG. 3B, in such a way as to cover the first metal wiring layer 29, the layer-insulating layer 27B made of the same material (e.g., SiO2) as that of the layer-insulating layer 27A under the first metal wiring layer 29 is deposited thereon to thereby flatten the upper surface thereof.

Since the two layer-insulating layers 27A and 27B are each made of the same material, after that deposition, these two layers become an integrated layer-insulating layer 27, and these two layers are formed in such a way as to sandwich the first metal wiring layer 29 therebetween.

Next, as illustrated in FIG. 4A, the grooves 33 each having a pattern for defining the memory node electrode (lower electrode) 24 are formed in the layer-insulating layer 27. At this time, it is arranged that each groove 33 passes through the insulating film (nitride film) 22 located under the layer-insulating layer 27 and further passes a part of the layer-insulating layer 21 located under the film 22 and reach the contact layer 17.

Subsequently, the material of the lower electrode 24 is deposited within the groove 33, to thereby form the lower electrode 24 in such a way that this electrode 24 remains to exist within the inner wall and bottom of the groove 33.

Next, in such a way as to cover the lower electrode 24 within the groove 33 and the layer-insulating layer 27, the materials for use as the dielectric film 25 and the plate electrode (upper electrode) 26 are sequentially deposited.

Further, these materials for use as the dielectric film 25 and plate electrode 26 are patterned so that the materials corresponding to the memory cell portion 2 and wiring taking-out portion may remain.

In this way, as illustrated in FIG. 4B, there is formed the capacitive element C composed of the memory node electrode (lower electrode) 24, dielectric film 25, and plate electrode (upper electrode) 26.

It is to be noted that as the materials of the memory node electrode 24 and plate electrode 26 it is possible to use metal material such as WN, TiN, or the like.

Also, as the material of the dielectric film 25, it is possible to use, for example, a material of $Ta_2O_5$ capable of being made relatively thin in terms of the thickness. And this material is deposited to a prescribed thickness of, for example, 10 nm or so.

In a case where the material of $Ta_2O_5$ is used as the dielectric film 25 in this way, since the film formation is performed using an organic CVD method, it is possible that carbon from the source gas be entrapped into the material of $Ta_2O_5$.

On this account, in order to eliminate the entrapped carbon, heat treatment, ultraviolet-ray radiation in an atmosphere of ozone, or the like is performed to thereby improve the leak characteristic of the dielectric film 25.

It is to be noted that this treating step is needed to be performed within a temperature range of from 350° C. to 450° C. so that the aluminum contained in the Al—Cu film 29B of the previously formed first metal wiring layer 29 will not be melted. Also, the thereafter-succeeding steps also are executed at a temperature of 450° C. or less for the same reason.

Next, in such a way as to cover the capacitive element C, the flattening insulating film 30 is formed. Further, the connecting holes are formed in such a way as to pass through the flattening insulating layer 30 and reach the wiring taking-out portion of the upper electrode 26 of the capacitive element C or the first metal wiring layer 29.

Within each of the connecting holes, the second contact layer 31 is formed while on the flattening insulating layer 30 there is formed the second metal wiring layer 32 having a prescribed pattern.

Thereafter, although not illustrated, insulating layers, etc. for covering the second metal wiring layer 32 are formed.

In this way, it is possible to manufacture the semiconductor device 1 having a structure illustrated in FIG. 1 and FIG. 2.

Conventionally, for the dielectric film 25 of the capacitive element C, a nitride film is used, and so in the manufacturing process of it there is performed heat treatment of 70° C. or more. Namely, when deposition, activation, and oxidation are performed using the CVD method, the temperature comes to fall within that range of temperature. This temperature is the one at which aluminum is melted.

Accordingly, it was necessary to form a metal wiring layer after the forming of the capacitive element.

In contrast to this, in the manufacturing method of this embodiment, by changing the material of each of the lower electrode 24 and upper electrode 26 of the capacitive element C from that of the conventional polycrystalline silicon electrode to that of a metal electrode, for example, to oxidation-resisting metal nitride such as WN, TiN, or the like, executing a low-temperature process has become possible.

Accordingly, it becomes possible to form the capacitive element C after having formed the first metal wiring layer 29 containing Al therein. As a result of this, between in the memory cell portion 2 and in other portions 3 and 4, it is possible to execute the deposition step, flattening step, etc. for its relevant layer with consistency.

Here, conventionally, for example, in the method of forming a metal wiring layer with a combined use of an electro-plating method and a CMP (Chemico-Mechanical Polishing Method), it was necessary in order to execute the CMP that each backing layer be flattened over an entire region of wafer beforehand.

In contrast to this, according to this embodiment, during a series of process steps of repeatedly forming the flattened layer-insulating layer and the metal wiring layer over a plurality of layers, the capacitive element C is formed using the manufacturing method having no adverse effect upon the flattenability in the region of the logic circuit 4. Therefore, it is possible to easily apply the wiring-manufacturing process step, that is a single-purpose process step, to an ordinary logic circuit 4.

Namely, executing a flattening step that was conventionally executed, after the forming of the capacitive element C, in order to embed the resulting difference in level, becomes unnecessary in this embodiment. Therefore, the manufacturing process can be simplified.

Subsequently, another embodiment of the present invention will now be explained.

In this embodiment, each of the first and the second metal wiring layer is formed of a buried metal layer, and the second metal wiring layer and the contact layer located thereunder are integrally formed using the same material.

Figure 5:
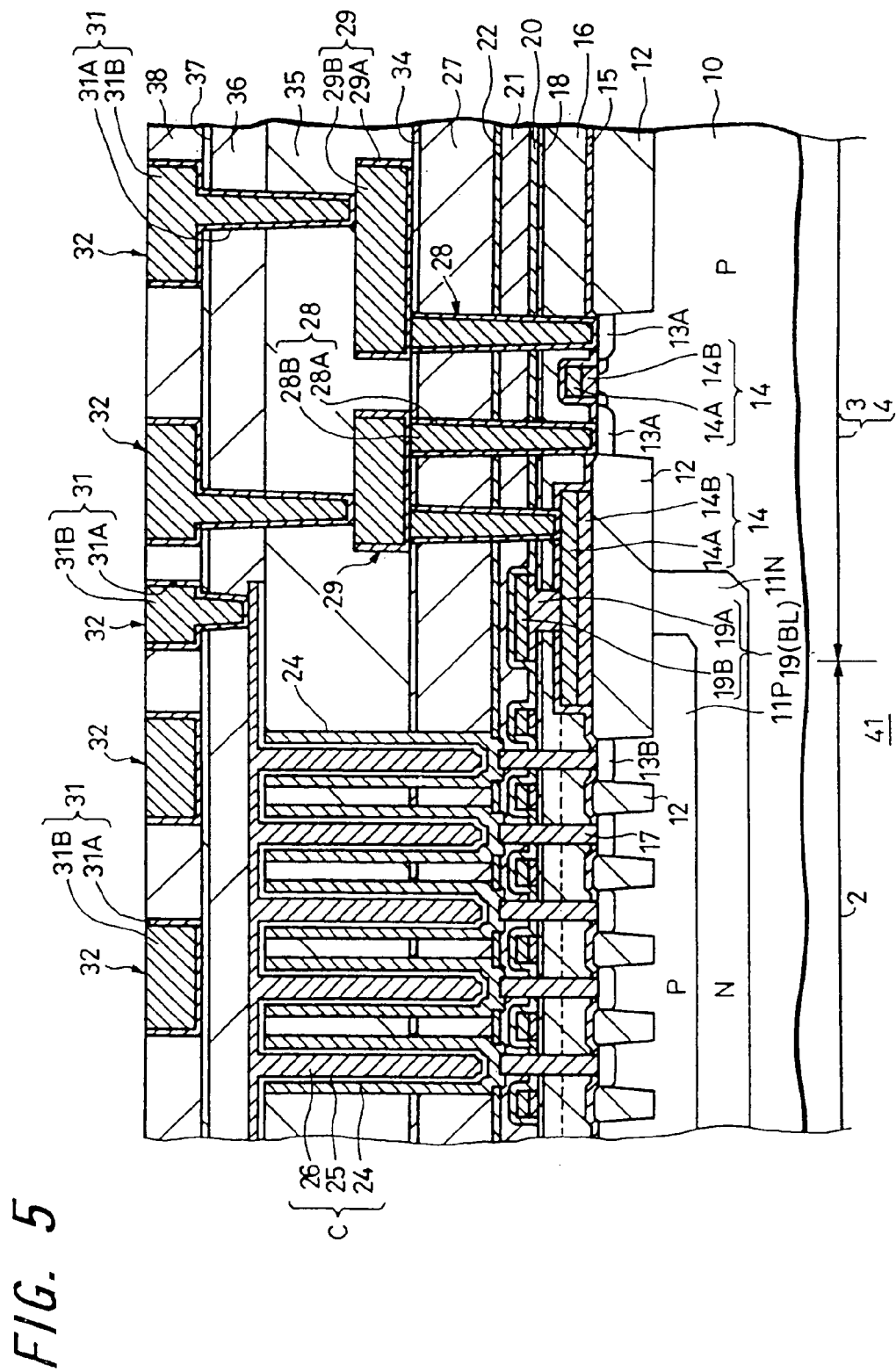
FIG. 5 is a schematic sectional view illustrating a semiconductor device according to another embodiment of the present invention.

FIG. 5 is a schematic sectional view illustrating a semiconductor device according to this another embodiment of the present invention.

The sectional view of FIG. 5 corresponds to the sectional view taken along the line A—A of FIG. 1 as in the case of FIG. 2.

In this semiconductor device 41, the first metal wiring layer 29 becoming a within-layer wiring is formed of a buried metal layer that has been embedded in a lower part of the layer-insulating layer 35. The first metal wiring layer 29 has a laminated structure of a barrier layer 29A and a buried layer 29B.

Also, similarly, the second metal wiring layer 32 becoming an upper wiring is formed of a buried metal layer that has been embedded in an insulating layer 38. Furthermore, the second metal wiring layer 32 is formed using the same material as that of the second contact layer 31. Namely, the second metal wiring layer 32 has a laminated structure of a barrier layer 31A and a buried layer 31B, and this second metal wiring layer 32 is formed by being integrated with the second contact layer 31.

The materials of the respective buried metal layers are, for example, as follows.

In the first contact layer 28, as in the case of the preceding embodiment, a laminated film of TiN film and a Ti film for example is used as the barrier layer 28A. A W film for example is used as the buried layer 28B.

The first metal wiring layer 29, in the case of this FIG. 5, is constructed using a material different from that of the first contact layer 28. Namely, for example by applying a dual da machine method of Cu, the first metal wiring layer 29 can be constructed of a backing barrier layer 29A made of Cu, which has been formed using the CVD method, and a buried layer 29B made of Cu, which has been formed using another method, for example, using a plating method.

Also, the second metal wiring layer 32 integrated with the second contact layer 31 can be made of the same material as that of the first metal wiring layer 29. Namely, the second metal wiring layer 32 can be constructed of a undercoating barrier layer 31A made of Cu and a buried layer 31B made of Cu, which has been formed using another method.

For the second metal wiring layer 32 integrated with the second contact layer 31, it is also possible to use a film of W, etc. as in the case of the first contact layer 28.

It is to be noted that in a case where, for the first metal wiring layer 29, using a W film, etc. as in the case of the first contact layer 28, the first metal wiring layer 29 can be made to have an integrated structure as in the case of the second metal wiring layer 32 illustrated in FIG. 5.

In this case, the first metal wiring layer 29 is formed simultaneously with the first contact layer 28.

In this embodiment, each of the first metal wiring layer 29 and second metal wiring layer 32 consists of a buried metal layer. Therefore, under the layer-insulating layers 35 and 38, respectively, there are formed insulating films (nitride films) 34 and 37 becoming stoppers for etching when forming grooves having embedded therein the metal wiring layers 29 and 32.

It is to be noted that under the insulating film (nitride film) 37 there is formed a flattening insulating layer 36 for the same purpose as that for which the flattening insulating layer 30 of FIG. 2 is formed.

Since other constructions are the same as those of the semiconductor device 1 illustrated in FIGS. 1 and 2, they are respectively denoted by like reference numerals and their duplex explanation is omitted.

According to the semiconductor device 41 of this embodiment, this semiconductor device 41 has the same effects as those attainable with the semiconductor device 1 of the preceding embodiment. In addition, the second metal wiring layer 32 is integrated with the second contact layer located thereunder with the use of the same material as that of the second contact layer. As a result of this, these two layers can be simultaneously formed to thereby reduce the number of the manufacturing process steps. Accordingly, the manufacturing process can be simplified.

Also, since the first metal wiring layer 29 and the second metal wiring layer 32 are formed of buried metal layers, respectively, it is possible to flatten the surface of the resulting structure. As a result of this, no level difference occurs by the use of the metal wiring layers 29 and 32.

The method of manufacturing the semiconductor device 41 will now be explained.

First, the same process steps as those illustrated in FIGS. 11A and 11B in connection with the conventional semiconductor device 101 are executed.

Namely, after having formed the contact layer 17 of the memory node electrode, the insulating film (nitride film) 22 is formed over the entire surface of the resulting structure. Up to this step, the manufacturing process steps are the same as those according to the preceding embodiment.

Next, on the insulating film (nitride film) 22, there is deposited the layer-insulating layer 27. And, on the layer-insulating layer 27, the insulating film (nitride film) 34 is formed. As previously stated, this insulating film (nitride film) 34 becomes a stopper for etching.

Further, on the insulating film (nitride film) 34, there is deposited the insulating film 35A whose thickness corresponds to the thickness of the first metal wiring layer 29 that is to be formed later.

And, in this insulating film 35A, by etching, grooves for defining the first metal wiring layer 29 are formed so as to reach the insulating film (nitride film) 34.

Figures 6A, 6B:
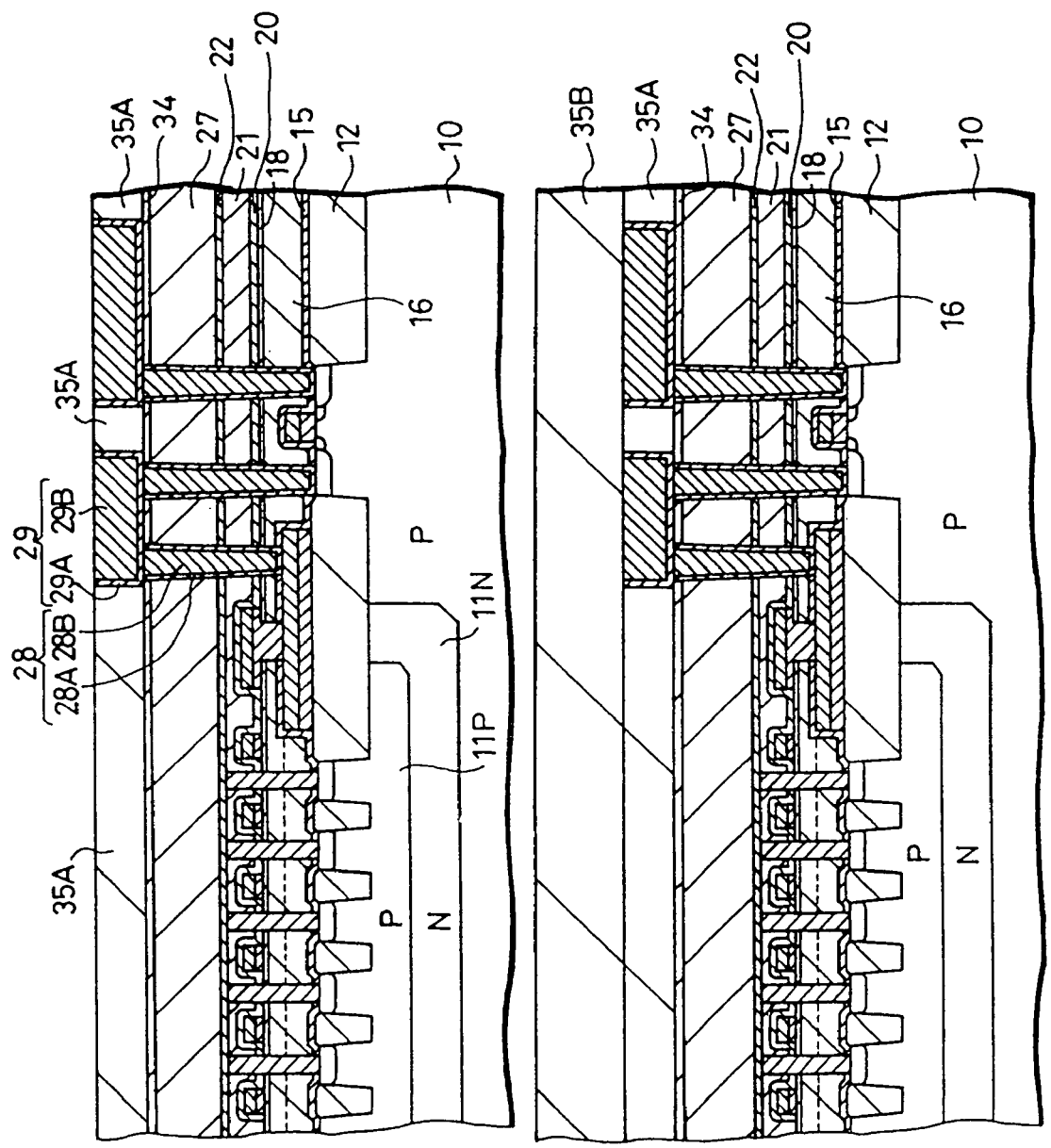
FIGS. 6A and 6B are process views each illustrating the process of manufacturing the semiconductor device of FIG. 5.

Subsequently, after having the thin barrier layer 29A, the buried layer 29B is formed so as to embed the groove. Etch-back is then done. As illustrated in FIG. 6A, the first metal wiring layer 29 consisting of the buried metal layer is thereby formed.

Next, as illustrated in FIG. 6B, the layer-insulating layer 35B is deposited covering the first metal wiring layer 29. This layer-insulating layer 35B is formed using the same material as that of the insulating layer 35A having buried therein the first metal wiring layer 29. As a result of this, the integrated layer-insulating layer 35 is formed.

Figure 7A:
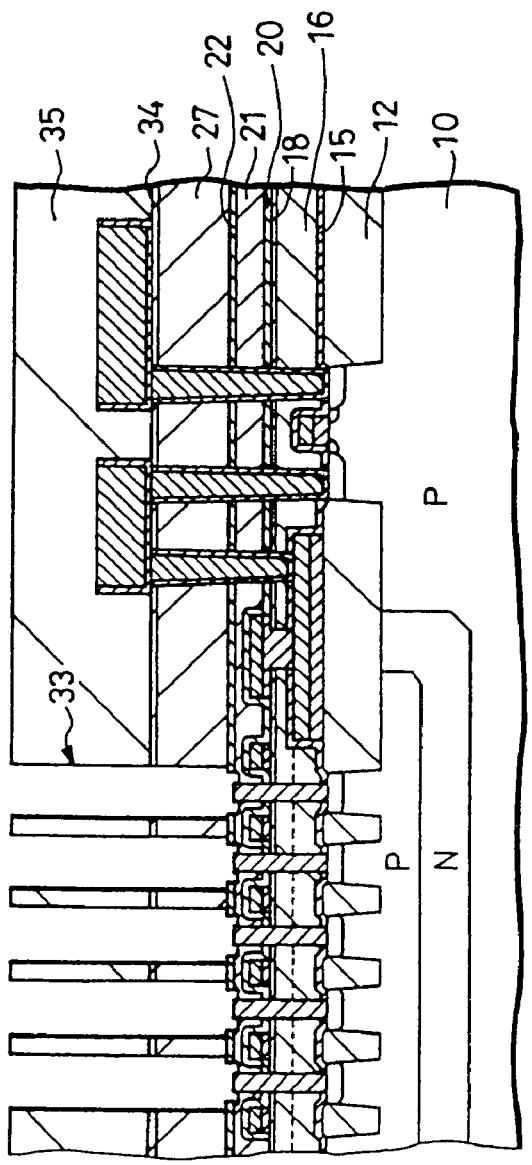
FIGS. 7A and 7B are process views each illustrating the process of manufacturing the semiconductor device of FIG. 5.

Next, as illustrated in FIG. 7A, the grooves 33 for defining the memory node electrodes (lower electrodes) 24 are formed in the layer-insulating layer 35, insulating film (nitride film) 34, and layer-insulating layer 27. At this time, the grooves 33 pass through the insulating film (nitride film) 22 located under the layer-insulating layer 27 and further pass through part of the layer-insulating layer 21 located thereunder. The grooves 33 are thereby made to reach the contact layer 17.

Subsequently, the material of the lower electrodes 24 is deposited within the grooves 33. And patterning is performed of the surface of the resulting structure so that the material may remain in the inner wall and bottom of the grooves 33 to thereby form the lower electrode 24.

Next, covering the lower electrodes 24 within the grooves 33 and the layer-insulating layer 35 from over the same, the materials of the dielectric film 25 and plate electrode (upper electrode) 26 are sequentially deposited.

Further, patterning is performed of the materials of this dielectric film 25 and plate electrode 26 so that the portion corresponding to the memory cell portion 2 and wiring taking-out portion may remain.

Figure 7B:
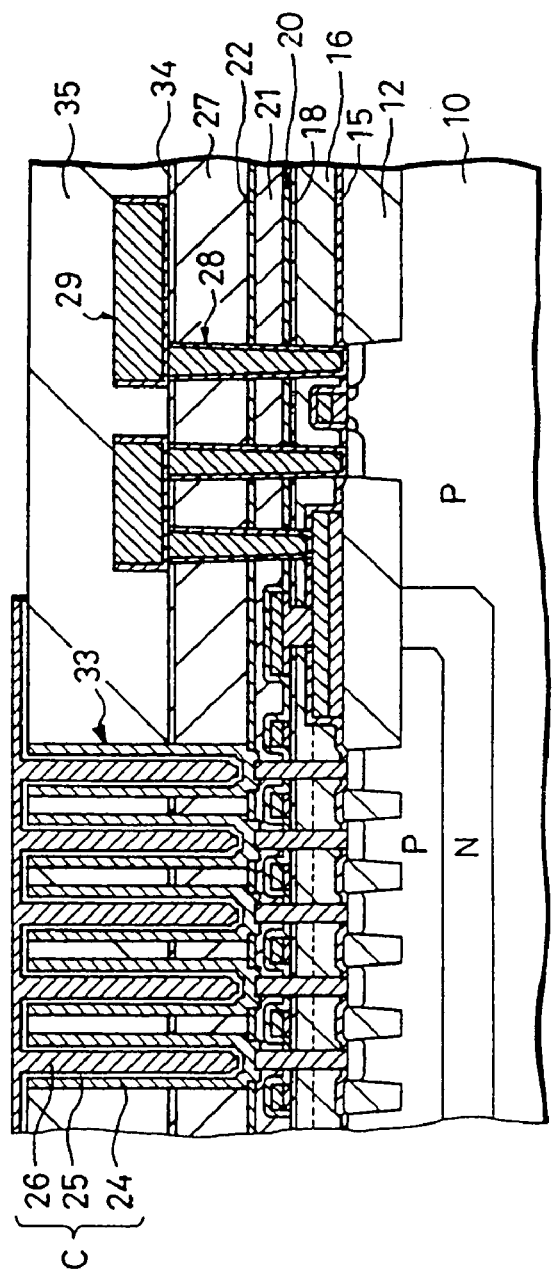

In this way, as illustrated in FIG. 7B, there is formed the capacitive element C composed of the memory node electrode (lower electrode) 24, dielectric film 25, and plate electrode (upper electrode) 26.

It is to be noted that, as the materials of the memory node electrode 24, dielectric film 25, and plate electrode 26, it is possible to use materials the same as those in the case of the semiconductor device 1 according to the preceding embodiment.

Next, covering the capacitive element C, the flattening insulating layer 36 is formed, on which the insulating film (nitride film) 37 and the insulating layer 38 are sequentially deposited.

Subsequently, the grooves for defining the second metal wiring layer portions 32 are formed in the insulating film 38. Also, in the insulating films 37, 36, and 35 located under the insulating layer 38, there are formed the connecting holes extended to the first metal wiring layer 29 or to the wiring taking-out portion of the plate electrode 26 of the capacitive element C.

These grooves and connecting holes can be formed with etching steps twice executed with the mask pattern being changed each time, and these grooves and connecting holes may be formed regardless of which one of them is formed earlier.

Next, the barrier layer 31A is formed within each of the grooves and connecting holes, and further the grooves and connecting holes are each embedded with the buried layer 31B. And, by performing etch-back, the second metal wiring layer 32 consisting of the buried metal layer is formed.

Although later steps are not illustrated, according to the necessity, a layer-insulating layer, or a metal wiring layer located further over the same, or the like, is formed.

In this way, the semiconductor device 41 having a construction illustrated in FIG. 5 can be manufactured.

Next, still another embodiment of the present invention will now be explained.

Figure 8:
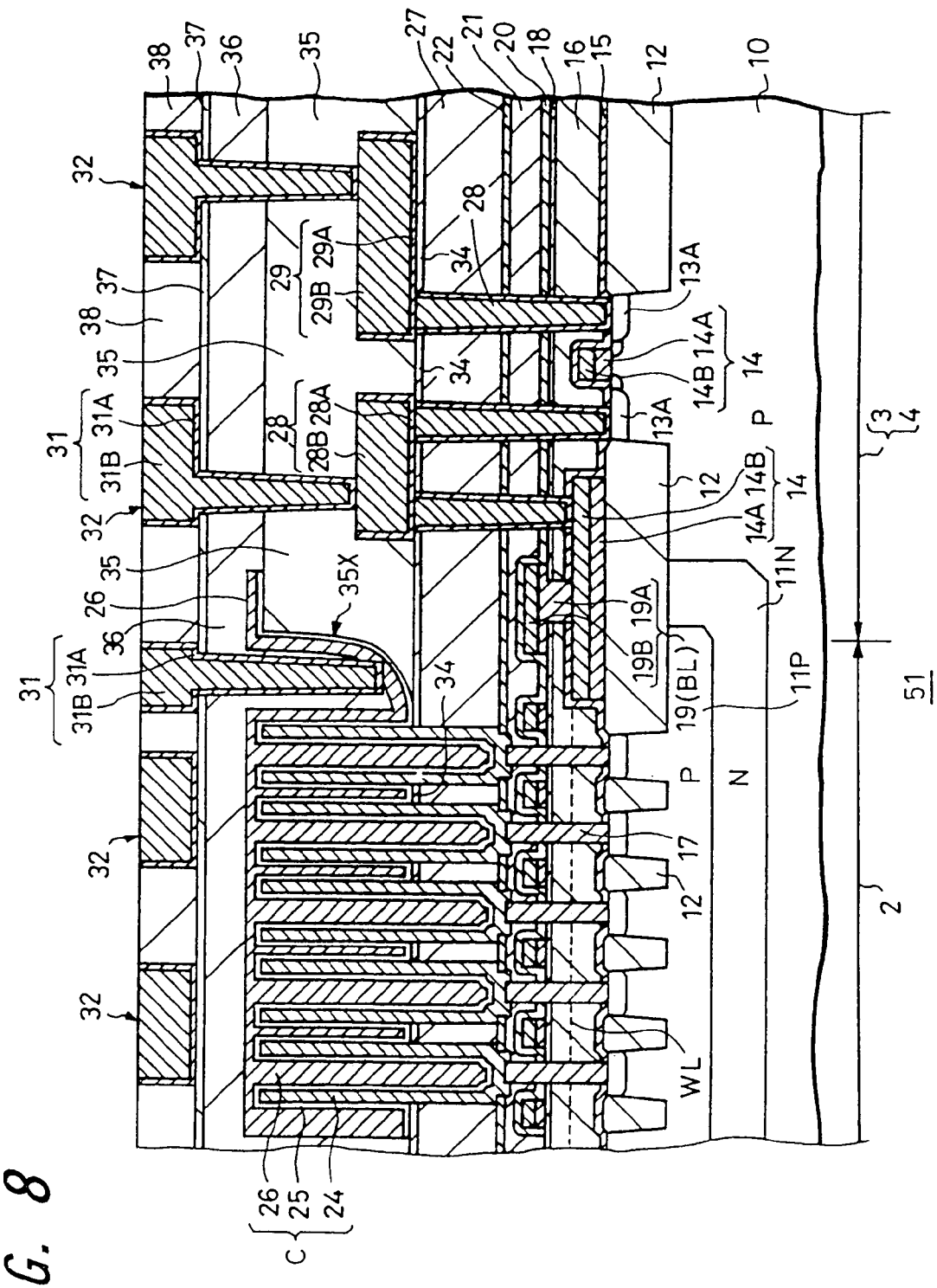
FIG. 8 is a schematic sectional view illustrating a semiconductor device according to still another embodiment of the present invention.

FIG. 8 illustrates a schematic sectional view of a semiconductor device according to still another embodiment of the present invention. The sectional view of this FIG. 8 corresponds to the sectional view taken along the line A—A of the plan view of FIG. 1 as in the case of FIG. 2.

In this semiconductor device 51, especially, part of the layer-insulating layer 35 corresponding to the memory cell portion 2 is eliminated and, correspondingly to this eliminated part, a concavity portion 35X is formed in such a way as to surround the memory cell portion 2.

And, along this concavity portion 35X, there is extended the wiring taking-out portion of the plate electrode (upper electrode) 26 of the capacity element C, and a terminal end of this wiring taking-out portion is extended up to over the layer-insulating layer 35.

Also, in this semiconductor device 51, the construction of the capacitive element C differs from that in the case of the preceding embodiment. It is to be noted that the configuration of the memory node electrode (lower electrode) 24 is the same as in the case of the preceding embodiment.

In this embodiment, since the layer-insulating layer 35 of the memory cell portion 2 is eliminated, no layer-insulating film 35 exists between the memory node electrodes (lower electrodes) 24 corresponding to the adjacent memory cells.

And, between the memory node electrodes (lower electrodes) 24 corresponding to the adjacent memory cells, instead of the layer-insulating layer 35, the dielectric film 25 and plate electrode (upper electrode) 26 are formed as in the case of the inside of the U-shaped structure of the memory node electrode (lower electrode) 24.

As a result of this, compared to each of the semiconductor devices 1 and 41 according to the preceding embodiments, the area of the portion of contact between the lower electrode 24 and the dielectric film 25 is made larger.

Also, to a midway position of that wiring taking-out portion of the plate electrode (upper electrode) 26 of the capacitive element C which has been formed along the concavity portion 35X of the layer-insulating layer 35, there is connected the contact layer extended from the second metal wiring layer 32.

The height of the position at which this contact layer and the wiring taking-out portion of the plate electrode 26 are connected to each other is approximate to the height of the first metal wiring layer 29.

For this reason, the depth of the second contact layer connected to the wiring taking-out portion of the plate electrode 26 and the depth of the second contact layer connected to the first metal wiring layer 29 are almost the same.

It is to be noted that, in this embodiment, the insulating film (nitride film) 34 that has been formed as a stopper for etching in order to make the first metal wiring layer 29 a buried metal layer serves concurrently as a stopper for the etching performed when eliminating the layer-insulating layer 35 corresponding to the memory cell portion 2.

Also, the height of the capacitive element C is almost the same as in the case of each of the semiconductor devices 1 and 41 according to the respective preceding embodiments.

Other constructions are the same as in the case of the semiconductor device 41 illustrated in FIG. 5, and therefore such constructions are denoted by like reference numerals and a duplex explanation thereof is omitted.

In this embodiment, by this embodiment being constructed as described above, it is possible to form the capacity also on the respective sides of the memory node electrodes (lower electrodes) 24 corresponding to the adjacent memory cells, i.e., on the outside surfaces of the U-shaped structure. As a result of this, the effective area constructing the capacity increases with the result that it is possible to increase the capacity of the capacitive element C.

When performing etching for forming the connecting holes of the contact layers, the conditions of etching are set in conformity with the deepest connecting hole. Therefore, when the difference in depth between the connecting holes is large, there is the problem that, regarding the shallow connecting holes, over-etching becomes likely to occur.

In contrast to this, in this embodiment, as described above, since the depths of the second contact layers are made almost the same, it is possible to suppress the occurrence of such over-etching.

Next, a method of manufacturing this semiconductor device 51 will be explained.

First, the same process steps as those illustrated in FIGS. 6A to 7A in connection with the semiconductor device 41 according to the preceding embodiment are executed.

Next, as in the case of the semiconductor device 1 according to the preceding embodiment, the material of the lower electrode 24 is deposited within the groove 33 for defining the memory node electrode (lower electrode) 24. Thereafter, patterning is performed of the resulting structure so that the material may remain on the inner wall and bottom of the groove, to thereby form the lower electrode 24.

Figure 9A:
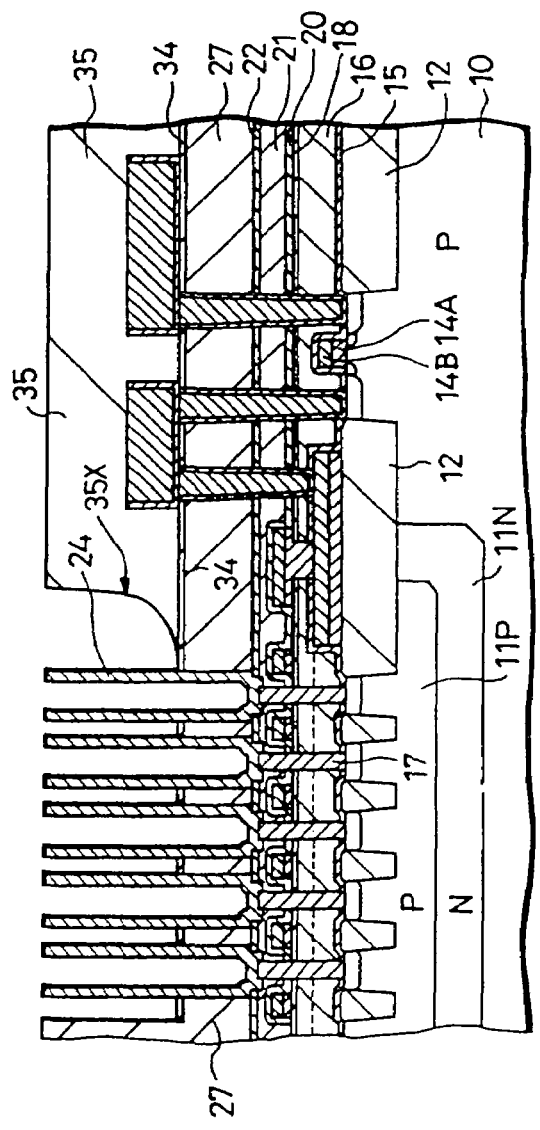
FIGS. 9A and 9B are process views each illustrating the process of manufacturing the semiconductor device of FIG. 8.

Thereafter, by anisotropic and/or isotropic etching, as illustrated in FIG. 9A, elimination is performed of the layer-insulating layer 35 of the memory cell portion 2. At this time, the insulating film (nitride film) 34 located under the layer-insulating layer 35 becomes a stopper for etching.

As a result of this, the layer-insulating layer 35 situated around the lower electrode 24 is eliminated. Simultaneously, the concavity portion 35X illustrated in FIG. 8 is formed in the layer-insulating layer 35.

Also, openings are formed in the inside and the outside of the U-shaped lower electrode 24.

Next, in such a way as to cover the memory node electrodes (lower electrodes) 24, the materials of the dielectric film 25 and plate electrode (upper electrode) 26 are sequentially deposited.

Figure 9B:
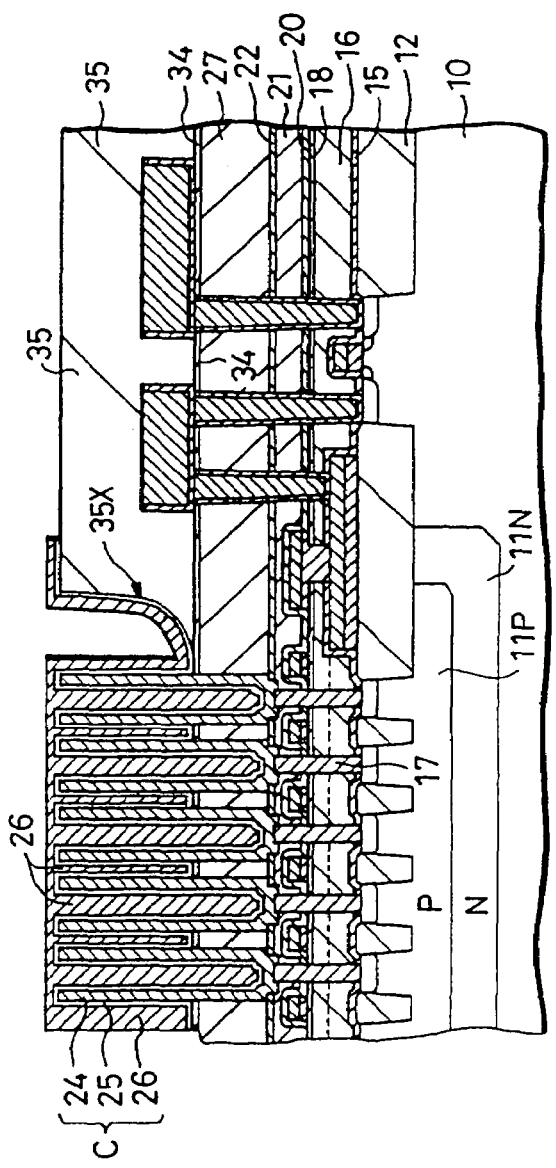

And, the materials of this dielectric film 25 and plate electrode 26 are patterned so that the portions thereof corresponding to the memory cell portion and wiring taking-out portion may remain. By this patterning, as illustrated in FIG. 9B, the capacitive element C composed of the memory node electrode 24, dielectric film 25, and plate electrode 26 is formed.

At this time, the wiring taking-out of the plate electrode 26 is formed along the concavity portion 35X of the layer-insulating layer 35 up to over the layer-insulating layer 35.

Next, in such a way as to cover the entire surface of the resulting structure, the flattening insulating layer 36 is formed, and further the insulating film (nitride film) 37 and the insulating layer 38 are formed sequentially.

And, thereafter, as in the case of the semiconductor device 41 according to the preceding embodiment, the second metal wiring layer 32 based on the use of the buried metal layer is formed by being integrated with the second contact layer.

In this way, it is possible to manufacture the semiconductor device 51 illustrated in FIG. 8.

Here, in the case of this embodiment, the groove 33 is formed in the insulating layers 35, 34, and 27, and then the lower electrode 24 is formed on the inner wall and bottom of the groove 33. Thereafter, with the lower electrode 24 remaining, the layer-insulating layer 35 situated around it is eliminated. Therefore, the resist-film increases one sheet in number as compared with that in the case of the preceding embodiment and, hence, the etching step increases one in number.

Accordingly, the construction of the semiconductor device 51 according to this embodiment is more suitable, especially when wanting to preferentially increase the capacity, than when wanting to simplify the manufacturing process.

The present invention is not limited to the above-described embodiments and permits other various constructions to be made without departing from the spirit and scope of the invention.

According to the above-described present invention, it is possible to form the capacitive element whose height is large enough to ensure the procurement of the capacity.

Further, it is possible to make shallow the contacting hole for use on the metal wiring layer and therefore to form the metal wiring layer without being adversely influenced by the capacitive element. Therefore, the increase in the degree of integration is possible.

Accordingly, in the semiconductor device having co-loaded thereon the semiconductor memory and the logic circuit, it is possible to realize both the increase in the capacity and the increase in the degree of integration.

Also, the flattening step that conventionally was performed for embedding the level difference after forming the capacitive element becomes unnecessary. This can simplify the manufacturing process.

Also, in the memory cell portion, when eliminating the insulating layer located over the first metal wiring layer in the memory cell portion and when having formed the capacitive element in this eliminated portion of the insulating layer, the area of the portion of contact between the lower electrode and the dielectric film becomes large. By making this area large, it becomes possible to increase the effective area of the capacitive element and hence to make the capacity larger.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor device comprising:
   (a) a semiconductor memory composed of a memory cell portion and a peripheral circuit portion and formed on a semiconductor substrate,
   (b) a plurality of word lines and a plurality of bit lines disposed in a matrix form in the memory cell portion;
   (c) a logic circuit on the semiconductor substrate;

(d) a capacitive element in the memory cell portion comprising an upper electrode and a memory node electrode;
(e) a first metal layer comprising a buried metal layer embedded within a connecting hole passing through first and second insulating films;
(f) a first metal wiring layer connected to the first metal layer;
(g) first and second insulating layers sandwiching the first metal wiring layer from above and below, the first metal wiring layer being formed on and in contact with the first insulating layer and the second insulating layer covering the first metal wiring layer, the first metal wiring layer being connected to a diffusion layer via the first metal layer, the logic circuit being connected to one or both of the diffusion layer formed in the semiconductor substrate and a lower-layer wiring on the semiconductor substrate, the diffusion layer extending obliquely across adjacent word lines;
(h) a second metal layer comprising a buried metal layer embedded within a connecting hole passing through a portion of the second insulating and connected to the first metal wiring layer;
(i) a second metal wiring layer that is formed on an insulating layer located above the capacitive element in such a way as to be connected to the second metal layer; and
(j) a dielectric layer being formed in the interior of a groove and on an insulating layer, the groove being formed in the first and second insulating layers and in the memory cell portion, a comb-like plate electrode covering the dielectric layer, the plate electrode does not extend beyond the capacitive element, the plate electrode being formed on the second insulating layer, wherein,
the capacitive element being formed in the groove and extending through the first and second insulating layers, and
a top portion of the second insulating layer being in the same horizontal plane as an upper surface of the memory node electrode.

2. The semiconductor device according to claim 1, wherein along the remaining portion of the insulating layer after the removal of the part of this insulating layer a wiring-taking out portion of the capacitive element is formed.

3. The semiconductor device according to claim 1, wherein the first metal wiring layer is formed integrally with the first metal layer by the use of the same material as that of the first metal layer.

4. The semiconductor device according to claim 1, wherein the second metal wiring layer is formed integrally with the second metal layer by the use of the same material as that of the first metal layer.

5. The semiconductor device according to claim 1, wherein the first metal wiring layer or the second metal wiring layer comprising a buried metal layer embedded within a corresponding insulating film.

6. A semiconductor device comprising:
(a) a semiconductor memory composed of a memory cell portion and a peripheral circuit portion and formed on a semiconductor substrate;
(b) a plurality of word lines and a plurality of bit lines disposed in a matrix form in the memory cell portion;
(c) a logic circuit on the semiconductor substrate;
(d) a capacitive element in the memory cell portion and covered by a flattening insulating layer, the capacitive element comprising an upper electrode and a memory node electrode;
(e) a first metal layer comprising a buried metal layer embedded within a connecting hole passing through first and second insulating films;
(f) a first metal wiring layer connected to the first metal layer;
(g) first and second insulating layers sandwiching the first metal wiring layer from above and below, the first metal wiring layer being formed on and in contact with the first insulating layer and the second insulating layer covering the first metal wiring layer, the first metal wiring layer being connected to a diffusion layer via the first metal layer, the logic circuit being connected to one or both of the diffusion layer formed in the semiconductor substrate and a lower-layer wiring on the semiconductor substrate, the diffusion layer extending obliquely across adjacent word lines, and a top portion of the second insulating layer being in the same horizontal plane as an upper surface of the memory node electrode;
(h) a second metal layer comprising a buried metal layer embedded within a connecting hole passing through a portion of the second insulating layer and connected to the first metal wiring layer;
(i) a second metal wiring layer that is formed on the flattening insulating layer located above the capacitive element in such a way as to be connected to the second metal layer;
(j) a groove formed in the memory cell portion and extending through the first and second insulating layers; and
(k) a dielectric layer in the interior of the groove and on a insulating layer and a comb-like plate electrode covering the dielectric layer, the plate electrode does not extend beyond the capacitive element, and the plate electrode being formed on the second insulating layer, wherein,
the capacitive element being formed in the groove and extending through the first and second insulating layers,
the first metal wiring layer being formed integrally with the first metal layer by the use of the same material as that of the first metal layer,
the second metal wiring layer being formed integrally with the second metal layer by the use of the same material as that of the first metal layer, and
the first metal wiring layer or the second metal wiring layer comprising a buried metal layer embedded within a corresponding insulating film.

* * * * *